United States Patent
Jensen

(10) Patent No.: US 10,504,608 B2
(45) Date of Patent: Dec. 10, 2019

(54) LINKED-LIST INTERLINEATION OF DATA

(71) Applicant: INTEL IP CORPORATION, Santa Clara, CA (US)

(72) Inventor: Jens H. Jensen, Aalborg (DK)

(73) Assignee: INTEL IP CORPORATION, Santa Clara, CA (US)

( * ) Notice: Subject to any disclaimer, the term of this patent is extended or adjusted under 35 U.S.C. 154(b) by 316 days.

(21) Appl. No.: 15/199,780

(22) Filed: Jun. 30, 2016

(65) Prior Publication Data

US 2018/0004598 A1     Jan. 4, 2018

(51) Int. Cl.
*G11C 29/52* (2006.01)
*G11C 16/16* (2006.01)
*G06F 11/10* (2006.01)
*G11C 29/56* (2006.01)
*G11C 29/04* (2006.01)

(52) U.S. Cl.
CPC .......... *G11C 29/52* (2013.01); *G06F 11/1048* (2013.01); *G11C 16/16* (2013.01); *G11C 2029/0411* (2013.01)

(58) Field of Classification Search
CPC .......... G06F 11/1068; G06F 17/30958; G06F 11/1048; G11C 16/16; G11C 29/52; G11C 2029/0411
See application file for complete search history.

(56) References Cited

U.S. PATENT DOCUMENTS

| | | | | |
|---|---|---|---|---|
| 5,438,573 A | * | 8/1995 | Mangan | G06F 3/0601 714/701 |
| 2006/0036802 A1 | * | 2/2006 | Drukin | G06F 17/30067 711/103 |
| 2007/0230493 A1 | * | 10/2007 | Dravida | H04L 47/14 370/412 |
| 2012/0246392 A1 | * | 9/2012 | Cheon | G06F 12/0871 711/103 |
| 2015/0106556 A1 | * | 4/2015 | Yu | G11C 16/349 711/103 |
| 2015/0363285 A1 | * | 12/2015 | Delaney | G06F 3/0619 714/6.12 |

OTHER PUBLICATIONS

Wikipedia, "Flash Memory", [online], last modified May 26, 2016, [Retrieved May 28, 2016], retrieved from the Internet at <URL: https://en.wikipedia.org/wiki/Flash_memory>, 20 pp.

* cited by examiner

*Primary Examiner* — April Y Blair
*Assistant Examiner* — Dipakkumar B Gandhi
(74) *Attorney, Agent, or Firm* — Konrad Raynes Davda & Victor LLP

(57) ABSTRACT

In one embodiment, linked-list interlineation of data in accordance with the present description includes inserting a subsequent set of data in a linked-list data structure within an initial data structure. The linked-list data structure includes a sequence of linked-list entries interspersed with the initial data of the initial data structure. To insert the subsequent data, a pattern of data within the initial data structure is replaced with data of the subsequent set of data in a sequence of linked-list entries of the linked-list data structure. Other aspects are described herein.

25 Claims, 9 Drawing Sheets

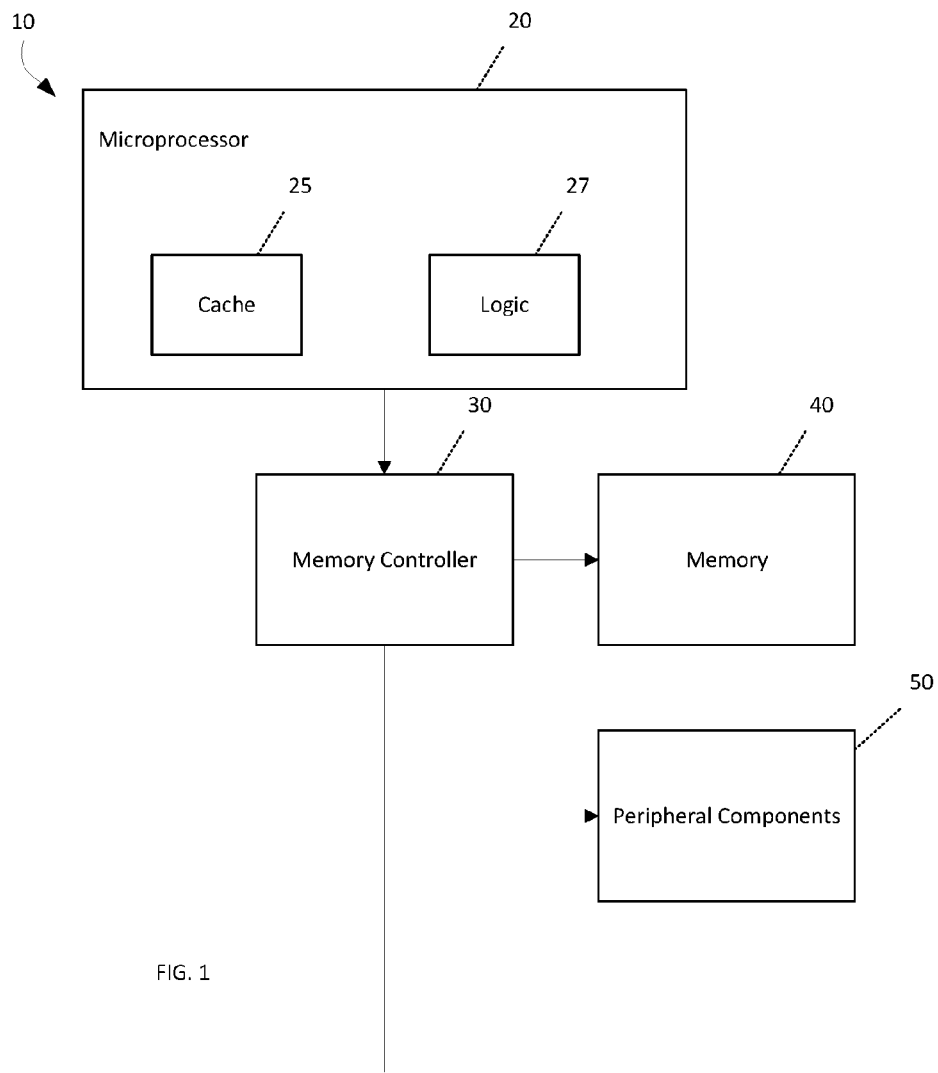
FIG. 1
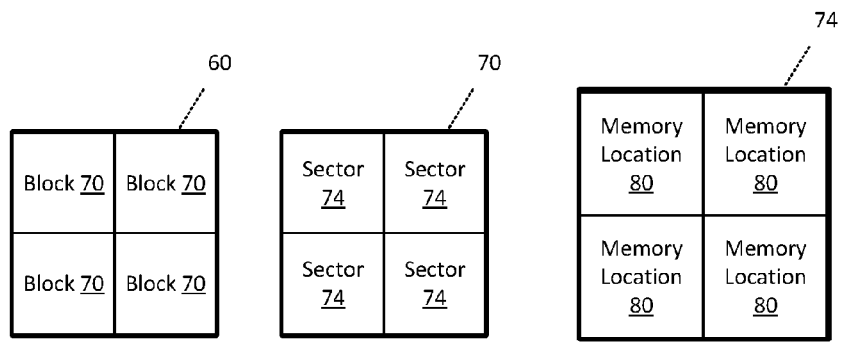
FIG. 3a
FIG. 3b
FIG. 3c

LINKED-LIST INTERLINEATION OF DATA

TECHNICAL FIELD

Certain embodiments of the present description relate generally to management of memory resources.

BACKGROUND

In contrast to volatile memory, non-volatile memory can store data that persists even after the power is removed from the non-volatile memory. However, in some types of non-volatile memory such as non-volatile flash memory, a write operation may change a bit of memory in only one direction, such as from a logical one state to a logical zero state, for example, without first erasing the particular bit of memory. Thus if a zero is written to a particular bit, that bit may not be changed back to a one state by another write operation. Instead, the bit is first "erased" which changes the bit back to a one state. After the bit is erased, a zero may be written to the erased bit.

Another limitation of some types of non-volatile memory such as flash memory, is that data can only be erased an entire block of memory locations at a time. As a result, instead of erasing a bit, byte or word of data at a time, an entire block encompassing many sectors or pages of data depending upon the size of the block of data, is erased at a time. Still further, such non-volatile memory typically has a limitation on the number of times a particular block of memory may be erased before the block "wears out" and loses the ability to reliably store data.

BRIEF DESCRIPTION OF THE DRAWINGS

Embodiments of the present disclosure are illustrated by way of example, and not by way of limitation, in the figures of the accompanying drawings in which like reference numerals refer to similar elements.

FIG. 1 depicts a high-level block diagram illustrating one embodiment of a system employing linked-list interlineation of data in accordance with the present description.

FIGS. 3a-3c depict various hierarchical levels of data storage of the memory of FIG. 2.

DESCRIPTION OF EMBODIMENTS

Figure 2:
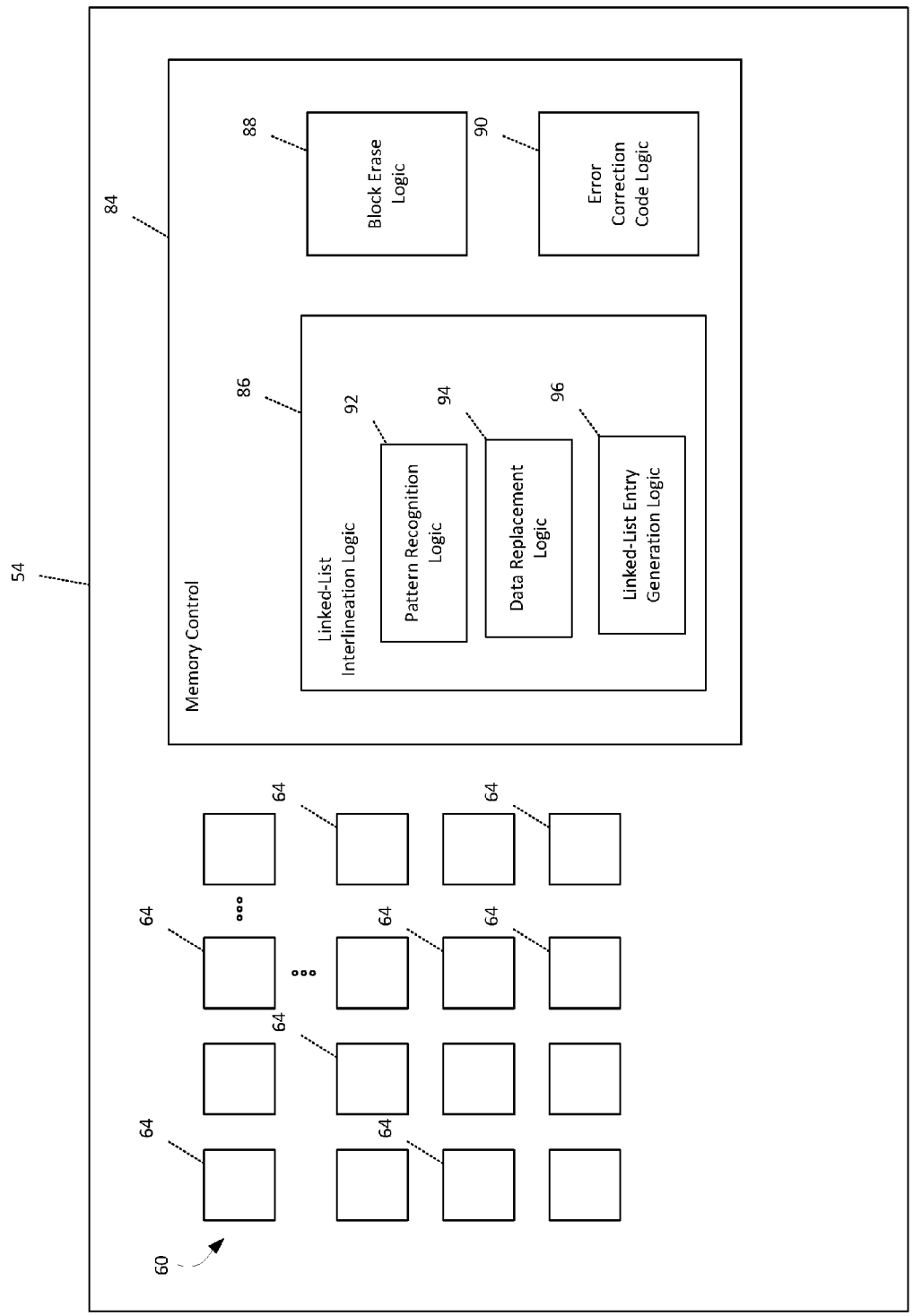
FIG. 2 depicts a basic architecture of a memory employing linked-list interlineation of data in accordance with the present description.

In the description that follows, like components have been given the same reference numerals, regardless of whether they are shown in different embodiments. To illustrate one or more embodiments of the present disclosure in a clear and concise manner, the drawings may not necessarily be to scale and certain features may be shown in somewhat schematic form. Features that are described or illustrated with respect to one embodiment may be used in the same way or in a similar way in one or more other embodiments or in combination with or instead of features of other embodiments.

In various known computer systems including portable devices such as cellular phones often referred to as "smart phones", for example, data is received from various subsystems of the overall system such as central processing, input/output, storage, audio, video, display, and battery subsystems, for example, and the data is stored in memory. As the data is received from the various subsystems, the data is frequently stored in non-volatile memory in subsections of the non-volatile memory often referred to as "sectors." If the received data is larger than a sector in size, the received data may be subdivided into "chunks" wherein each full-size chunk of data has the size of a sector. Each full-size chunk of data is stored in a corresponding sector and fills that sector except for those types of memory having an error correction code (ECC) field which is reserved for error correction code data encoding the data of the sector for error detection and correction purposes and other possible uses as well. If the received data is smaller than a sector in size, it is typically padded with one-bits up to the sector size and this data is written to an empty sector including the padded bits and the ECC data calculated on the whole sector. In this manner, typically only one update is written to a sector, such that the next update is written to the next sector etc.

As previously mentioned, known non-volatile memory devices such as NAND and NOR flash memory for example, frequently have a limitation in which memory is erased a block at a time, rather than a sector (or word, byte etc.) at a time. Accordingly, previously stored data is typically not changed in known systems employing such memory without erasing an entire block of data. Moreover, if the previously stored data has been encoded in an error correction code, the error correction code stored in the sector also is not changed to reflect the new data. As a result, if the received data is an update (that is, a later version) of previously received and stored data, in known systems the update data is typically stored in new memory locations which have previously been erased to avoid erasing an entire block of data just to change a portion of the data previously stored. In this manner, the new data is appended in new memory locations to the prior data already stored rather than erasing an entire block of data. However, once a block of sectors becomes full, the latest versions of data stored in that block are copied over to sectors in a new block of sectors and the original block of sectors is erased.

It is recognized herein that received update data may differ from a prior version of data stored in a sector by only a few bits. However, because the previous version of the data and the error correction code stored in a sector typically cannot be changed without erasing an entire block of sectors, in known systems having such limitations, slightly changed update data is stored in a new sector rather than updating the original sector. As a result, it is appreciated that small changes in update data can cause sectors and ultimately blocks of memory to be rapidly filled and erased notwithstanding that relatively little new data is being received. Consequently, it is appreciated that blocks of memory in known systems have been erased and rewritten at a rate which may cause premature wearing out of those blocks of memory.

In one aspect of the present description, linked-list interlineation of data is employed in a system of one or more computers configured to perform particular operations or actions of linked-list interlineation of data by virtue of having software, firmware, hardware, or a combination of them installed on the system that in operation causes or cause the system to perform the actions. One or more computer programs can be configured to perform particular operations or actions of linked-list interlineation of data by virtue of including instructions that, when executed by data processing apparatus, cause the apparatus to perform the actions.

One general aspect of linked-list interlineation of data in accordance with the present description includes linked-list interlineation logic configured to store a subsequent set of data within memory locations in which an initial set of data has already been stored. In one embodiment, the subsequent set of data which may be referred to as "update data", for example, may be stored interlineated and interspersed amongst the previously stored initial set of data without first erasing the sector containing the initial set of data. As a result, the frequency of erasing blocks of memory may be reduced so as to extend the life of the memory.

In one embodiment, a linked-list interlineation logic includes pattern recognition logic configured to identify a particular pattern of previously stored data (referred to herein as a "first pattern" of data) which may be interspersed among the data of the initial set of data already stored in the memory sector. For example, the pattern of data may be a string of ones which may be determined to be stored in a subset of memory locations interspersed within the initial set of memory locations storing the initial set of data in the memory sector. In one aspect of linked-list interlineation of data in accordance with the present description, one or more instances of the first pattern of data may be replaced with data of the subsequent set of data. In those embodiments in which the first pattern of data is a string of ones (0xFF (hexadecimal)), for example, it is appreciated that such a string may be readily replaced with data of the subsequent set without first erasing the memory sector since bits may be changed from a one state to a zero state without first erasing the bit in various types of flash memory, for example. Similarly, bits may remain in the logical one state as appropriate without first erasing the bit.

Accordingly, pattern recognition logic of the linked-list interlineation logic may be configured to identify a subset of memory locations within the initial set of memory locations, as a function of at least a first pattern of data wherein the memory locations of the subset of memory locations may be interspersed with other memory locations of the initial set of memory locations. Further, data replacement logic of the linked-list interlineation logic, may be configured to replace data of at least the first pattern of data stored in the subset of memory locations with a subsequent set of data. As explained in greater detail below, in one embodiment, the subsequent set of data may be stored interspersed within the initial set of data, in a linked-list data structure having a sequence of linked-list entries. Linked-list generation logic of the linked-list interlineation logic may be configured to generate a sequence of linked-list entries to store the subsequent set of data. In one embodiment, each entry of the sequence of linked-list entries may include one or more fields such as header, error correction code, payload, sequence length and pointer location fields as described in greater detail below. Additional sets of update data may be stored in the same sector in additional sequences of linked-list entries in a similar manner. Other embodiments of this aspect include corresponding computer systems, apparatus, and computer programs recorded on one or more computer storage devices, each configured to perform the actions of the methods.

In another aspect of linked-list interlineation in accordance with the present description, the subsequent set of data stored in a sector interlineated with the initial set of data may be readily read and distinguished from the initial set of data. Accordingly, linked-list interlineation logic is configured to read the fields of an entry of a sequence of linked-list entries in which the fields may include for example, a header field, and a payload field storing at least a portion of the data of the subsequent set of data. A pointer location field stores the location of the next-in-sequence entry of the sequence of linked-list entries storing the subsequent set of data.

The sequence of linked-list entries may be traversed in this manner, using the pointer location field of each entry to identify and read the next-in-sequence entry of the sequence of linked-list entries storing the subsequent set of data. A sequence length field of an entry of the sequence of linked-list entries may be provided to indicate the total length of all the entries of the sequence of linked-list entries and thus may be utilized to determine when the entire sequence of linked-list entries storing the subsequent set of data has been located. One or more of the entries of the sequence of linked-list entries may also include an error correction code field to store error correction code data for purposes of detecting and correcting storage or read errors of the sequence of linked-list entries. Additional sets of update data may be read from the same sector which have been stored in additional sequences of linked-list entries in a similar manner.

It is noted that ECC data can be used both for fault detection and for power loss detection. Accordingly, if the ECC data does not correspond to the data on which it was calculated, an indication is provided that there may have been a power loss or that an error occurred in the memory hardware device. In the event that the discrepancy is determined to be the result of a power loss, the update containing the discrepancy may in some embodiments be entirely disregarded. However, if the power loss occurred during the calculation and storage of the ECC data, the update portion of the data successfully stored prior to the power loss may in some instances, be considered to be sufficiently reliable to be of use. In still another aspect of linked-list interlineation in accordance with the present description, the sector of data containing the sequences of linked-list entries interspersed with the initial set of data, may be read and stored in a buffer. Each sequence of linked-list entries storing update data may be replaced in the buffer with the original first pattern of data which restores the initial set of data of the sector to the state it was in at the time it was encoded with error correction code data. Accordingly, the initial error correction code data of the initial set of data stored in the sector may be applied for purposes of detecting and correcting storage or read errors of the initial set of data.

Implementations of the described techniques may include hardware, a method or process, or computer software on a computer-accessible medium. In one embodiment, linked-list interlineation of a subsequent set of data in an initial set of data is described in connection with data storage such as storing uncompressed data, for example. However, it is appreciated that linked-list interlineation may be applied to other applications as well. For example, linked-list interlineation may be applied to data transmission and reception devices transmitting and receiving data. Thus, in one example, a data transmission device transmitting a photograph which is digitally encoded, may employ linked-list interlineation in accordance with the present description to insert or embed metadata in the photograph in one or more sequences of linked-list entries, by recognizing and replacing patterns of bits representing an area of the original photograph with a sequence of linked-list entries representing metadata which may describe properties of the photograph or the manner in which the photograph was taken, for example.

It is appreciated that linked-list interlineation of data in accordance with the present description may be applied to a variety of host, storage and other memory devices such as for example, memory devices that use chalcogenide phase change material (e.g., chalcogenide glass), three-dimensional (3D) crosspoint memory, or memory that incorporates memristor technology. Additional memory devices which may benefit from linked-list interlineation of data in accordance with the present description may include other types of byte-addressable, write-in-place non-volatile memory, ferroelectric transistor random-access memory (FeTRAM), nanowire-based non-volatile memory, Magnetoresistive random-access memory (MRAM), Spin Transfer Torque (STT)-MRAM, Phase Change Memory (PCM), storage class memory (SCM), universal memory, Ge2Sb2Te5, programmable metallization cell (PMC), resistive memory (RRAM), RESET (amorphous) cell, SET (crystalline) cell, PCME, Ovshinsky memory, ferroelectric memory (also known as polymer memory and poly(N-vinylcarbazole)), ferromagnetic memory (also known as Spintronics, SPRAM (spin-transfer torque RAM)), STRAM (spin tunneling RAM), magnetic memory, magnetic random access memory (MRAM), and Semiconductor-oxide-nitride-oxidesemiconductor (SONOS, also known as dielectric memory). It is appreciated that other types of memory may benefit from linked-list interlineation of data in accordance with the present description, depending upon the particular application.

Turning to the figures, FIG. 1 is a high-level block diagram illustrating selected aspects of a computing system implemented according to an embodiment of the present disclosure. System 10 may represent any of a number of electronic or other computing devices, that may include a memory device. Such electronic devices may include a telephone modem and other computing devices such as a mainframe, server, personal computer, workstation, telephony device, network appliance, virtualization device, storage controller, portable or mobile devices (e.g., laptops, netbooks, tablet computers, personal digital assistant (PDAs), portable media players, portable gaming devices, digital cameras, mobile phones, smartphones, feature phones, etc.) or component (e.g. system on a chip, processor, bridge, memory controller, memory, etc.). System 10 can be powered by a battery, renewable power source (e.g., solar panel), wireless charging, or by use of an AC outlet.

In alternative embodiments, system 10 may include more elements, fewer elements, and/or different elements. Moreover, although system 10 may be depicted as comprising separate elements, it will be appreciated that such elements may be integrated on to one platform, such as systems on a chip (SoCs). In the illustrative example, system 10 comprises a microprocessor 20, a memory controller 30, a memory 40 and peripheral components 50 which may include, for example, video controller, input device, output device, storage, network adapter, a power source (including a battery, renewable power source (e.g., photovoltaic panel), wireless charging, or coupling to an AC outlet), etc. The microprocessor 20 includes a cache 25 that may be part of a memory hierarchy to store instructions and data, and the system memory 40 may also be part of the memory hierarchy. Communication between the microprocessor 20 and the memory 40 may be facilitated by the memory controller (or chipset) 30, which may also facilitate in communicating with the peripheral components 50.

Peripheral components 50 which are storage devices may be, for example, non-volatile storage, such as solid-state drives (SSD), magnetic disk drives, optical disk drives, a tape drive, flash memory, etc. The storage may comprise an internal storage device or an attached or network accessible storage. The microprocessor 20 is configured to write data in and read data from the memory 40. Programs in the storage are loaded into the memory and executed by the processor. A network controller or adapter enables communication with a network, such as an Ethernet, a Fiber Channel Arbitrated Loop, etc. Further, the architecture may, in certain embodiments, include a video controller configured to display information represented by data in a memory on a display monitor, where the video controller may be embodied on a video card or integrated on integrated circuit components mounted on a motherboard or other substrate. An input device is used to provide user input to the processor, and may include a keyboard, mouse, pen-stylus, microphone, touch sensitive display screen, input pins, sockets, or any other activation or input mechanism known in the art. An output device is capable of rendering information transmitted from the processor, or other component, such as a display monitor, printer, storage, output pins, sockets, etc. The network adapter may embodied on a network card, such as a Peripheral Component Interconnect (PCI) card, PCI-express, or some other I/O card, or on integrated circuit components mounted on a motherboard or other substrate. The peripheral devices 50 may also include RF receiver/transmitters such as in a mobile telephone embodiment, for example. Additional examples of peripheral devices 50 which may be provided in the system include an audio device and temperature sensor to deliver temperature updates for storage in the memory.

One or more of the components of the device 10 may be omitted, depending upon the particular application. For example, a network router may lack a video controller, for example.

Any one or more of the memory devices 25, 40, and the other devices 10, 30, 50 may include a memory employing linked-list interlineation of data in accordance with the present description, or be embodied as any type of data storage capable of storing data in a persistent manner (even if power is interrupted to non-volatile memory) such as but not limited to any combination of memory devices that use for example, chalcogenide phase change material (e.g., chalcogenide glass), three-dimensional (3D) crosspoint memory, or other types of byte-addressable, write-in-place non-volatile memory, ferroelectric transistor random-access memory (FeTRAM), nanowire-based non-volatile memory, phase change memory (PCM), memory that incorporates memristor technology, Magnetoresistive random-access memory (MRAM) or another Spin Transfer Torque (STT)-MRAM as described above. Such memory elements in accordance with embodiments described herein can be used either in stand-alone memory circuits or logic arrays, or can be embedded in microprocessors and/or digital signal processors (DSPs). Additionally, it is noted that although systems and processes are described herein primarily with reference to microprocessor based systems in the illustrative examples, it will be appreciated that in view of the disclosure herein, certain aspects, architectures, and principles of the disclosure are equally applicable to other types of device memory and logic devices.

FIG. 2 shows an example of a memory 54 which may be employed as a host memory or storage employing linked-list interlineation of data in accordance with the present description. The memory 54 has a rectangular or orthogonal array 60 of rows and columns of cells such as the bitcells 64, in which each bitcell 64 is configured to store a bit state.

The array 60 of bitcells may be subdivided in an array of blocks 70 (FIG. 3a). Depending upon the size of the memory, the array 60 of bit cells may have tens, hundreds, thousands, or more of such blocks 70. In the illustrated embodiment, the memory 54 is a non-volatile memory such as a flash memory, for example, in which each block 70 represents the smallest subunit of the memory 54 which may be erased at one time.

Each block 70 may in turn be subdivided into an array of sectors 74 (FIG. 3b). Depending upon the size of the memory, a block 70 of sectors 74 may have tens, hundreds, thousands, or more of such sectors 74. Each sector 74 may in turn be subdivided into an array of memory locations 80 (FIG. 3c). Depending upon the size of the memory, a sector 74 of memory locations 80 may have tens, hundreds, thousands, or more of such memory locations 80. Each memory location includes one or more bitcells 64 to store a bit, a byte, a word or other subunit of data, depending upon the particular application. Although linked-list interlineation is described in connection with storing data in a sector, it is appreciated that other units of data storage such as pages, tracks, segments, files, volumes, disks, drives, etc., may be utilized, depending upon the particular application.

The memory 54 may also include a row decoder, a timer device and I/O devices (or I/O outputs). Bits of the same memory word may be separated from each other for efficient I/O design. A multiplexer (MUX) may be used to connect each column to the required circuitry during a READ operation. Another MUX may be used to connect each column to a write driver during a WRITE operation. A memory control logic 84 such as a memory controller is configured to control and perform read and write operations directed to the bitcells 64 as explained below. The memory control logic 84 is configured to perform the described operations using appropriate hardware, software or firmware, or various combinations thereof. The hardware, software or firmware of the memory control logic 84 may be physically or logically located in any component of the system including the memory itself, a controller such as a memory controller, a microprocessor, etc.

As explained in greater detail below, the memory control logic 84 includes linked-list interlineation logic 86. In one embodiment, the memory control logic 84 further includes block erase logic 88 configured to erase an erasable block 70 (FIG. 3a) of the memory 54 at a time, and error correction code logic 90 configured to generate error correction codes to be stored in the memory 54 for purposes of detecting and correcting read and storage errors in the memory 54. The block erase logic 88 is configured to change all bits of an erasable block to a common bit state (typically a logical one state) to erase an erasable block of the non-volatile flash memory wherein an erasable block is the smallest unit of the non-volatile memory capable of being erased at a time. Hardware components of the memory control logic 84 may be a part of the memory 54 as depicted in FIG. 2, or may be physically or logically separate as indicated for the memory controller 30 with respect to the memory 40 of FIG. 1.

In one embodiment, the linked-list interlineation logic 86 includes pattern recognition logic 92 configured to recognize patterns of data, such as one or more strings of bits in the "one" state, such as one or more strings of eight bits, wherein each eight bit string may be represented as the hexadecimal value 0xFF, for example. Thus, the 0xFF hexadecimal pattern is a string of bits which are exclusively of a common bit state, the logical one state in this example. It is appreciated that other patterns of data may be utilized in linked-list interlineation in accordance with the present description, depending upon the particular application. The linked-list interlineation logic 86 further includes data replacement logic 94 configured to replace patterns of data recognized by the pattern recognition logic 92, with one or more sequences of linked-list entries configured to store additional sets of data in a sector in which an initial set of data has already been stored. The entries of the sequences of linked-list entries may be generated by a linked-list entry generation logic 96 of the linked-list interlineation logic 86.

Figure 4:
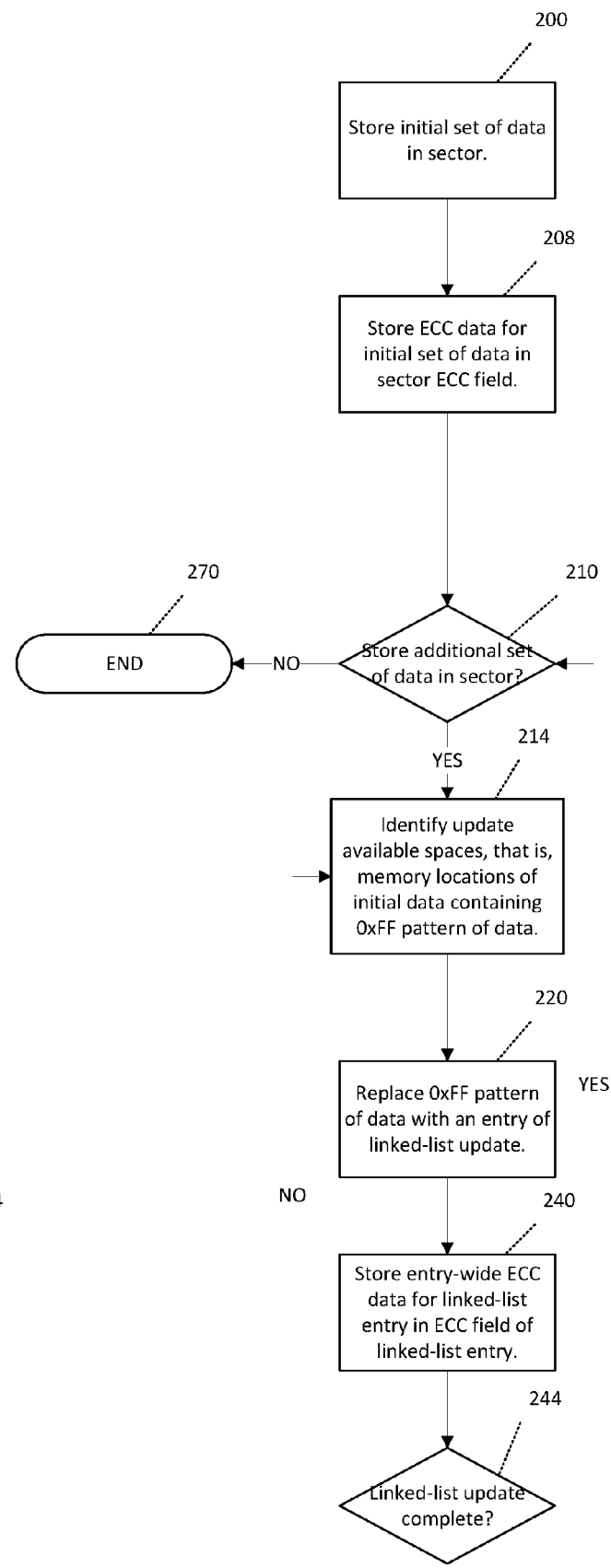
FIG. 4 depicts an embodiment of operations of linked-list interlineation of data in accordance with the present description.

FIG. 4 depicts one example of operations for linked-list interlineation in accordance with one embodiment of the present description, which may be performed by the memory control logic 84, for example, which is configured to control input/output operations to a memory such as the memory 54, for example. In this example, the memory 54 (FIG. 2) has memory locations 80 (FIG. 3c) configured to store data in one or more linked-list data structures as described in greater detail below.

In the operations of FIG. 4, the memory control logic 84 is configured to store (block 200, FIG. 4) an initial set of data in a data field 201 (FIG. 5a) of an initial data structure U1 having an initial set of memory locations 80 (FIG. 3c) of the sector 74 (FIG. 5a) of the memory 54. In this embodiment, the data structure U1 is a sector 74. Although linked-list interlineation in accordance with the present description is described in connection with storing data in a sector, it is appreciated that other units of data storage such as pages, tracks, segments, files, volumes, disks, drives, etc., may be utilized, depending upon the particular application.

Figure 5A:
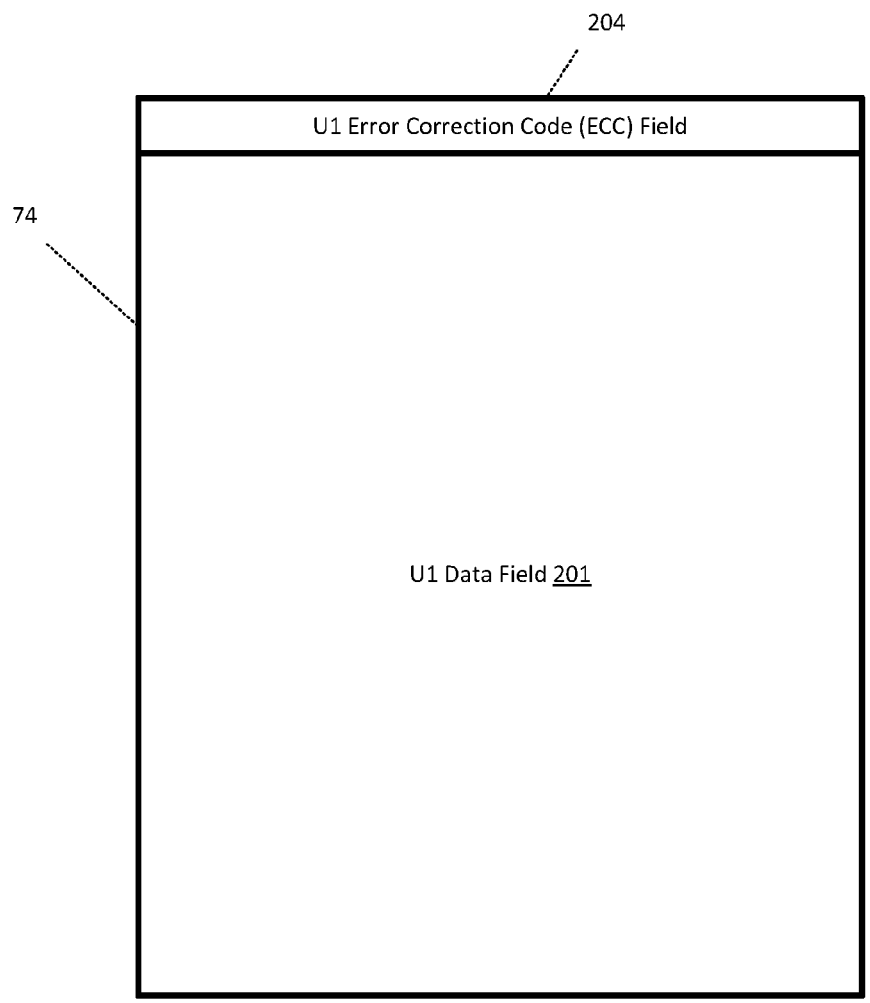
FIGS. 5a-5d depict various stages of linked-list data structures being stored in a sector of memory in accordance with one example of linked-list interlineation of data in accordance with the present description.

In known systems, an error correction code data field 204 (FIG. 5a) is frequently reserved. In the embodiment of FIG. 5a, the data field 201 occupies all or substantially all of the available space of the sector 74 for data storage except the ECC field 204.

If the data received at one time is smaller than the field 201 in size, it is typically padded with one-bits to fill the field 201 in its entirety such that the field 201 prior to linked-list interlineation in accordance with the present description, typically contained just a single set of data (including the pad bits added to the received data). Accordingly, an error correction code is calculated (block 208) for the entire field 201 containing the initial set of data (including pad bits) of the data structure U1, by error correction code logic such as the error correction code logic 90 (FIG. 2) of the memory control logic 84. In one embodiment, the error correction code logic 90 is configured to calculate the error correction code as a function of all the bits of the sector 74 previously stored in the sector 74 (with the possible exception of the bits of the error correction code itself), and as such, the error correction code calculated for the initial data of the sector may be referred to as a "sector-wide" error correction code. Once calculated, the memory control logic 84 is configured to store (block 208, FIG. 4) the sector-wide error correction code data in the ECC reserved field 204 (FIG. 5a) of the sector.

In the embodiment of FIG. 5a, the initial data structure U1 is depicted as occupying the entire sector 74 and having two fields 201, 204. It is appreciated however that a sector may have additional data structures external or internal to the data structure U1 which may have additional fields other than the fields 201, 204 as well. Accordingly, the error correction code stored in the ECC field 204 may in some embodiments be a function of a portion only of the data of the sector 74.

The error correction code logic 90 is further configured to detect and correct storage errors in the initial set of data as a function of the error correction code data. Accordingly, should a read, write or storage error be encountered in the initial set of data of the data structure U1 read back from the sector, such an error may be detected and corrected utilizing the sector-wide error correction code stored in the reserved field 204 for the sector. Thus, the entire storage capacity of the sector 74 including a reserved error correction code field 204 has typically been utilized for data storage of an initial set of data of the data structure U1 and the sector-wide error correction code or in which most if not all of the storage capacity of the sector including a reserved error correction code field has been utilized for data storage of an initial set of data of the data structure U1 including the sector-wide error correction code. Accordingly, once data storing (block 200) has filled the sector to capacity or near capacity (block 202), with the initial set of data of the data structure U1, and the sector-wide error correction code is calculated and stored (block 208), known systems typically do not store further updates in the sector but instead store the future updates in a sector not yet filled because the data in the field 201 and the error correction code stored in the error correction code field 204 is typically not erased and rewritten in known systems absent erasing an entire block of storage at a time. As previously mentioned, such known storage practices may lead to premature wearing out of the memory due to excessive filling and then erasing of blocks of memory.

In one aspect of linked-list interlineation in accordance with the present description, it is recognized that the initial set of data of the data structure U1 filling the sector after the sector-wide ECC code has been stored in the sector, typically includes a number of instances of strings of bits exhibiting a particular pattern of data. It is further recognized herein that such strings of bits exhibiting a particular pattern of data may be utilized to store yet another set of data interspersed with the initial set of data of the data structure U1, even after the sector has been "filled" with the initial set of data of the data structure U1 including the sector-wide ECC code which has been calculated and stored in the field 204. One such pattern of data which may be utilized in linked-list interlineation in accordance with the present description is one or more strings of bits in the "one" state, such as one or more strings of eight bits, wherein each eight bit string may be represented as the hexadecimal value 0xFF. It is appreciated that other patterns of data may be utilized in linked-list interlineation in accordance with the present description, depending upon the particular application.

Accordingly, in that linked-list interlineation in accordance with the present description provides an opportunity to store additional data in a sector even after the sector has been "filled" (block 200) with the initial set of data of the data structure U1 and the sector-wide ECC code has been calculated based upon that initial set of data of the data structure U1 and stored (block 208), a determination (block 210) is made whether to store additional data in the sector 74. To store the additional data in the "filled" sector, in this embodiment, the memory control logic 84 (FIG. 2) includes linked-list interlineation logic 86 configured to, after the memory control logic 84 stores the initial set of data in the sector 74, store within a subset of the initial set of memory locations storing the initial set of data of the data structure U1, a subsequent set of data which may be update data updating the initial set of data of the data structure U1 which was previously stored (block 200).

To locate the subset of memory locations to store the additional data, the linked-list interlineation logic 86 includes pattern recognition logic 92 (FIG. 2) configured to identify (block 214, FIG. 4) a subset of memory locations within the initial set of memory locations storing the initial set of data of the data structure U1, as a function of at least the first pattern of data which may be strings of eight ones (0xFF) in one embodiment as previously mentioned. The memory locations storing the particular pattern of data are referred to herein as an "update available space" since an instance of the pattern may be replaced with data of the subsequent set of data being added to the sector. In one embodiment, the pattern recognition logic 92 (FIG. 2) determines if there are sufficient update available spaces for storing the update. If not, the sector may be skipped and another sector examined.

Figure 5E:
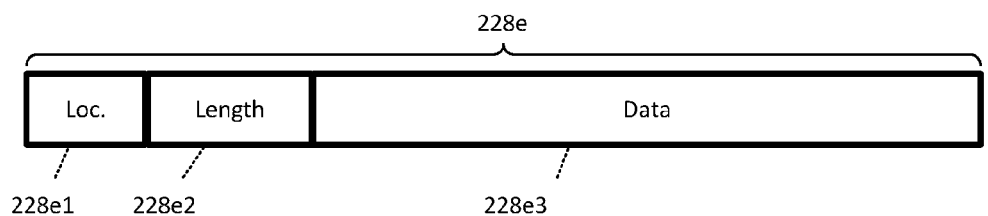
FIG. 5e depicts an example of fields within a payload field of an entry of a linked-list data structure in accordance with one example of linked-list interlineation of data in accordance with the present description.
Figure 5B:
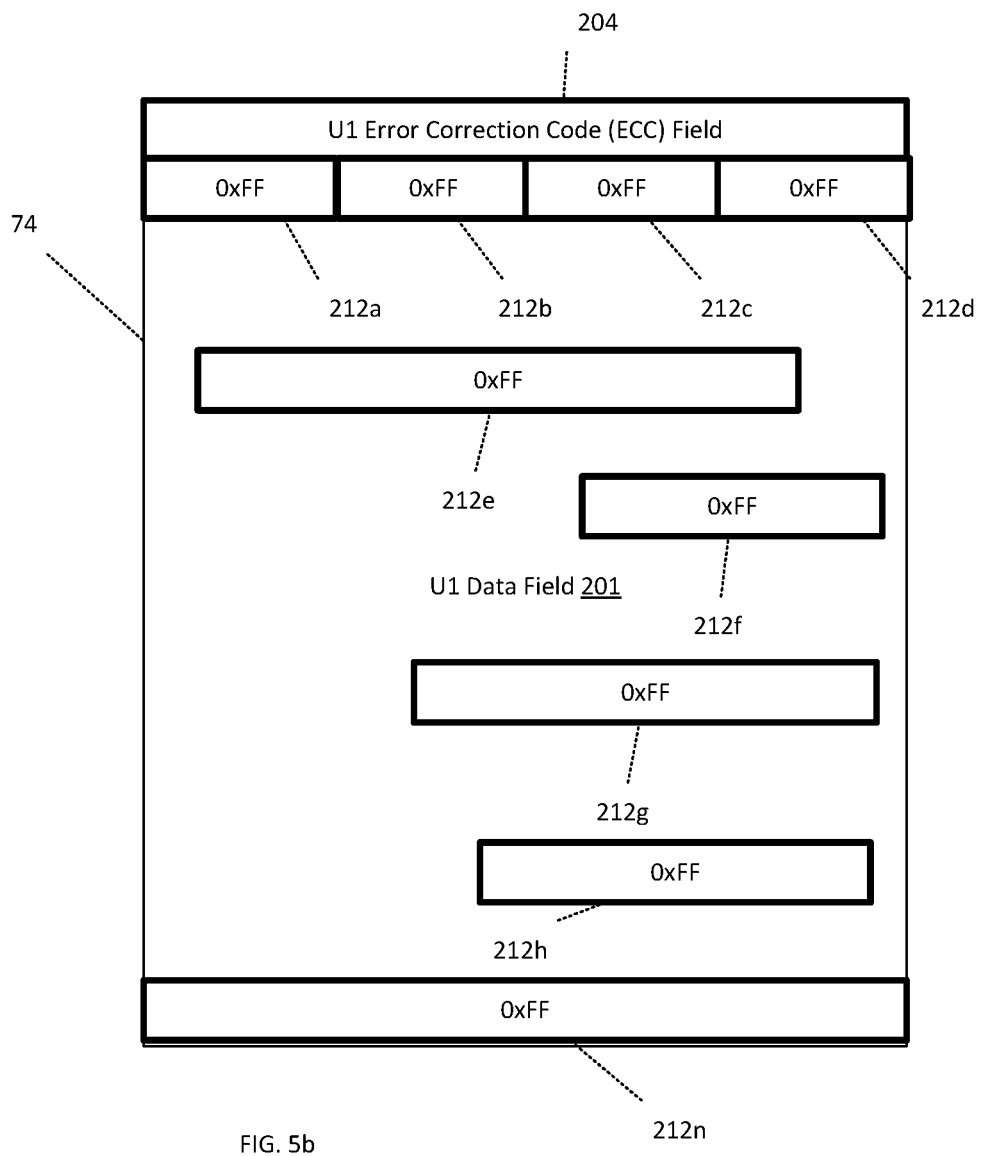

FIG. 5b shows an example of a subset of memory locations of the sector 74, which have been recognized by the pattern recognition logic 92 (FIG. 2) as storing the 0xFF pattern within the initial set of data stored in the data field 201 of the data structure U1, and accordingly are indicated as update available spaces 212a, 212b, 212c, 212d, 212e, 212f, 212g, 212h . . . 212n. Each update available space includes one or more memory locations 80 (FIG. 3c), each memory location storing the 0xFF pattern. As shown in FIG. 5b, the update available spaces 212a, 212b . . . 212n, each storing one or more instances of the particular pattern or patterns, may be interspersed throughout the U1 data field 201 of the sector and thus may be interspersed and intermingled with the memory locations storing the remaining data of the initial set of data of the data structure U1. The remaining data of the initial set of data of the data structure U1 does not exhibit the particular pattern which is the 0xFF pattern in this example.

In one embodiment, a limited section of update available spaces may be reserved within the initial data structure U1 in each sector for initial entries of sequences of linked-list data structures. In this embodiment, the update available spaces 212a, 212b, 212c and 212d, for example, have been reserved in sector 74 for initial entries of linked-list data structures. It is appreciated that in other embodiments, a greater or fewer number may be reserved and not used for storing data of the initial update U1. Accordingly, in this example, the first entry 224a (FIG. 5d) of the linked-list data structure U2 is stored in the reserved update available spaces 212a, 212b (FIG. 5b). As a result, the initial entry 224a (FIG. 5d) of the linked-list data structure U2 may be readily located by reading from the reserved spaces.

Figure 5C:
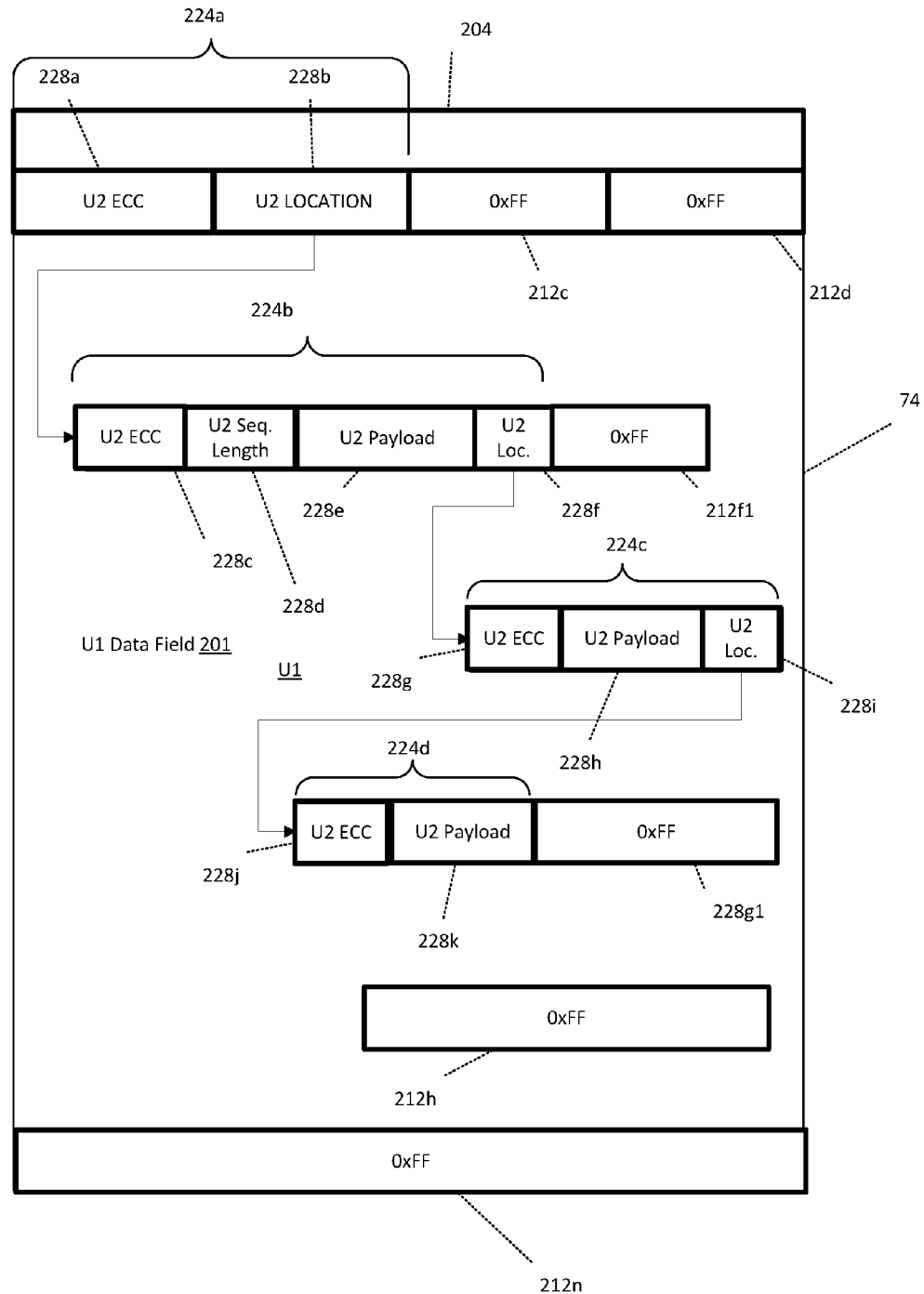

The linked-list interlineation logic 86 (FIG. 2) further includes data replacement logic 94 configured to replace (block 220, FIG. 4) data of at least the first pattern (0xFF in this example) of data stored in the identified subset 212a, 212b, 212c, 212d, 212e, 212f, 212g, 212h . . . 212n of memory locations with a subsequent set of data (FIG. 5c) in a data structure such as a linked-list data structure U2 having a sequence of linked-list entries 224a, 224b, 224c, 224d, for example. Accordingly, in this example, the data replacement logic 94 replaces (block 220, FIG. 4) the 0xFF pattern stored in one or more of the update available spaces 212a, 212b . . . 212n identified by the pattern recognition logic 92 with update data in a linked-list data structure U2 as shown in FIG. 5c having a sequence of linked-list entries 224a, 224b, 224c, 224d.

More specifically in this example, a first linked-list entry 224a (FIG. 5c) of the data structure U2 is stored in and thus replaces the update available spaces 212a, 212b (FIG. 5b). Similarly, a second, next-in-sequence linked-list entry 224b (FIG. 5c) of the data structure U2 is stored in and thus replaces a portion of the update available spaces 212e (FIG. 5b), a third, next-in-sequence linked-list entry 224c (FIG. 5c) of the data structure U2 is stored in and thus replaces the update available space 212f (FIG. 5b), and a fourth, next-in-sequence linked-list entry 224d (FIG. 5c) of the data structure U2 is stored in and thus replaces a portion of the update available space 212g (FIG. 5b).

In this example, the sequence of linked-list entries 224a, 224b, 224c, 224d of the data structure U2 need not be contiguous with each other within the sector 74 but instead may be separated by a number of memory locations containing remaining data of the initial set of data stored in the U1 data field 201 (or ECC field 204) of the data structure U1. In this manner, the sequence of linked-list entries 224a, 224b, 224c, 224d of the linked-list data structure U2 are interspersed with the remaining data of the initial set of data of the data structure U1 as shown in FIG. 5c. Some types of flash memory such as NOR flash memory permit individual bytes to addressed with write data at the byte or word level, for example.

In this embodiment, the linked-list interlineation logic 86 (FIG. 2) includes linked-list entry generation logic 96 configured to generate a sequence of linked-list entries such as the sequence of linked-list entries 224a, 224b, 224c, 224d, of the linked-list data structure U2 (FIG. 5c), for example. Thus, in this example, the linked-list data structure U2 includes a first linked-list entry 224a, and a second, next-in-sequence entry 224b with respect to the first linked-list entry 224a of the first linked-list data structure U2. The linked-list data structure U2 further includes a third, next-in-sequence entry 224c with respect to the entry 224b, and a fourth, next-in-sequence entry 224d with respect to the third linked-list entry 224c of the t linked-list data structure U2.

As shown in FIG. 5c, the linked-list data structure U2 includes fields 228a, 228b, 228c, 228d, 228e, 228f, 228g, 228h, 228i, 228j, 228k which are placed in the sequence of linked-list entries 224a-224d of the linked-list data structure U2. In this embodiment, the data replacement logic 94 (FIG. 2) is configured to store the fields 228a-228k in the appropriate entry of the sequence of linked-list entries of the data structure U2.

In the illustrated embodiment, each linked-list entry 224a, 224b, 224c, 224d, of the linked-list data structure U2 (FIG. 5c), includes a header field 228a, 228c, 228g and 228j, respectively. The first linked-list entry 224a includes a pointer location field 228b, and the data replacement logic 94 is further configured to store location data in the pointer location field 228b of the first linked-list entry 224a. The location data stored in the pointer location field 228b points (as represented by an arrow) to the location of the second, next-in-sequence linked-list entry which is entry 224b of the sequence of linked-list entries of the linked-list data structure U2 in the example of FIG. 5c. In a similar manner, location data stored in a pointer location field 228f of the second linked-list entry 224b points (as represented by an arrow) to the location of the third, next-in-sequence linked-list entry which is entry 224c of the sequence of linked-list entries of the linked-list data structure U2 in the example of FIG. 5c, and location data stored in a pointer location field 228i of the third linked-list entry 224c points (as represented by an arrow) to the location of the fourth, next-in-sequence, and final linked-list entry which is entry 224d of the sequence of linked-list entries of the linked-list data structure U2 in the example of FIG. 5c. The location data may be in the form of a physical or logical address in one embodiment, or may be in the form of an offset address, for example. In this manner, the sequence of linked-list entries 224a, 224b, 224c, 224d, of the linked-list data structure U2 are linked together by the pointer location fields of the linked-list entries. As explained in greater detail below, the sequence of entries of the linked-list data structure U2 may be located and read by traversing the linked-list data structure U2, using the pointer location fields 228b, 228f, 228i to find the next-in-sequence entries of the linked-list data structure U2.

In the example of FIG. 5c, the memory locations of the sector 74 are logically configured as an array of rows and columns of memory locations in which addresses of the memory locations of each row of memory locations increase from left to right in FIG. 5c, and the addresses of the memory locations of each column increase from top to bottom of the sector 74 in FIG. 5c. Accordingly, in this example, each next-in-sequence entry is at a higher memory location than the prior linked-list entry of the sequence of linked-list entries depicted in FIG. 5c. Thus, a traversal of the sequence of linked-list entries depicted in FIG. 5c is generally in a direction from top to bottom as indicated by the arrows between entries, corresponding to the direction of increasing columnar addresses. However, it is appreciated that a sequence of linked-list entries need not be in a uniform direction, either top to bottom, or left to right. Thus, for example, a second, next-in-sequence entry may have an address within the sector that is lower than the address of the first entry, a third, next-in-sequence entry may have an address within the sector that is higher than one or both of the first and second entries, a fourth, next-in-sequence entry may have an address within the sector that is higher than one or more of the first, second and third entries, etc. As a result, a traversal of a sequence of linked-list entries may change direction multiple times, from a direction of increasing addresses to a direction of decreasing addresses and vice versa.

One or more of the linked-list entries 224a, 224b, 224c, 224d, of the sequence of linked-list entries of the linked-list data structure U2 (FIG. 5c), includes a payload field such as the payload field 228e of the entry 224b, the payload field 228h of the entry 224c and the payload field 228k of the entry 224d. The update data of the subsequent set of data to be stored in the sequence of linked-list entries of the linked-list data structure U2 (FIG. 5c), is stored in such payload fields.

One or more of the linked-list entries 224a, 224b, 224c, 224d, of the sequence of linked-list entries of the linked-list data structure U2 (FIG. 5c), further includes a sequence length field such as the sequence length field 228d of the entry 224b. The sequence length field identifies the total length of the sequence of linked-list entries of the linked-list data structure U2 in a suitable unit such as bytes, for example. As explained in greater detail below, the sequence length data stored in the sequence length field 228d may be used to confirm that the entire sequence of linked-list entries of the linked-list data structure U2 has been located and read in a subsequent read operation.

Once the data for the length, payload and/or locations fields for a particular entry of the sequence of linked-list entries has been determined, an error correction code is calculated for those fields of the entry by error correction code logic such as the error correction code logic 90 (FIG. 2) of the memory control logic 84. In one embodiment, the error correction code logic 90 is configured to calculate the error correction code as a function of all the bits of an entry (with the possible exception of the bits of the error correction code itself), and as such, the entry error correction code calculated for each entry of the sequence of entries may be referred to as an "entry-wide" error correction code. Once calculated, the data replacement logic 94 (FIG. 2) is configured to store (block 240, FIG. 4) the entry-wide error correction code data in the header field 228*a*, 228*c*, 228*g*, 228*j* of the associated entry. It is appreciated that ECC data may be stored in other fields of an entry of a sequence of linked-list entries, depending upon the particular application.

In a subsequent read operation, the error correction code logic 90 is further configured to detect and correct storage errors in the subsequent set of data as a function of error correction code data stored in the sequence of linked-list entries. Accordingly, should a read, write or storage error be encountered in a read operation for an entry storing all or a portion of the subsequent set of data of the data structure U2, such an error in an entry may be detected and corrected utilizing the entry-wide error correction code stored in the header field for the particular entry. Although each entry of the sequence of linked-list entries has its own entry-wide error correction code data, it is appreciated that in other embodiments, error correction code may be generated for more than one entry including all entries in a sequence-wide error correction code, for example.

Although described in connection with error correction code calculation and storage in the illustrated embodiment, it is appreciated that linked-list interlineation in accordance with the present description may be utilized in connection with data storage which does not calculate and store error correction codes. Accordingly, in some embodiments, the error correction code calculation and storage of blocks 208, 240 may be optional.

Figure 5D:
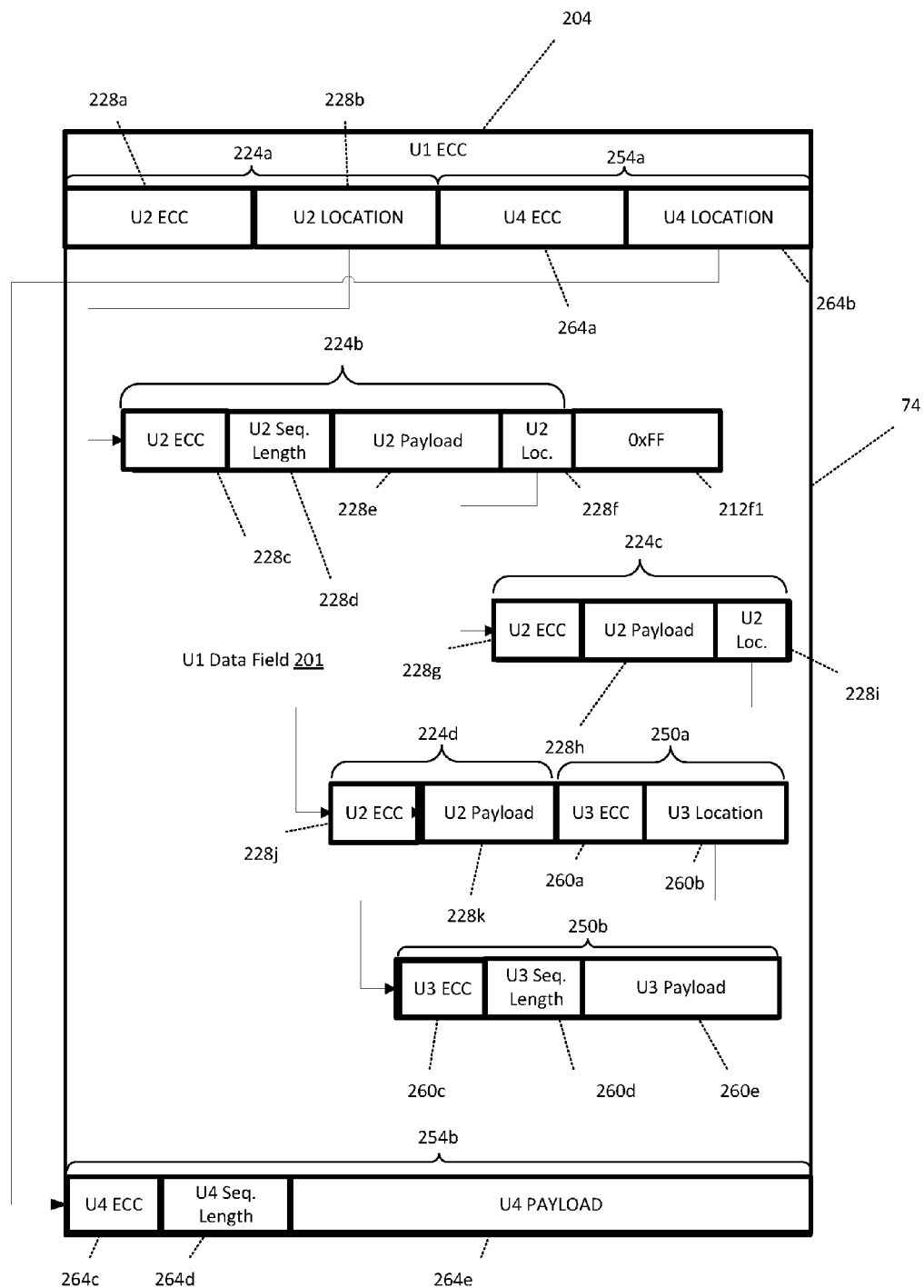

Once all entries 224*a*-224*d* of the sequence of linked-list entries of the linked-list data structure U2 have been stored, the data structure U2 is complete (block 244, FIG. 4), and the linked-list interlineation logic 86 can await (block 210) additional subsequent sets of data to be stored in the sector with the previously stored initial data of the data structure U1 and the previously stored data structure U2 containing a subsequent set of data. For example, FIG. 5*d* shows an added linked-list data structure U3 for storing a third set of data in a sequence of linked-list entries 250*a*-250*b*, and an added linked-list data structure U4 for storing a fourth set of data in a sequence of linked-list entries 254*a*, 254*b*. The linked-list entry 250*a* of the linked-list data structure U3 is stored in the update available space 228*g* (FIG. 5*c*) and includes an ECC header field 260*a*, and a pointer location field 260*b* which points to the location of an ECC header field 260*c* of the next-in-sequence entry 250*b*1 of the data structure U3. The entry 250*b* is stored in the update available space 212*h* (FIG. 5*c*) and further includes a sequence length field 260*d* and a payload field 260*e*. The linked-list entry 254*a* of the linked-list data structure U4 is stored in the update available spaces 212*c*, 212*d* (FIG. 5*c*) and includes an ECC header field 264*a*, and a pointer location field 264*b* which points to the location of an ECC header field 264*c* of the next-in-sequence entry 254*b*. The entry 254*b* is stored in the update available space 212*n* (FIG. 5*c*) and further includes a sequence length field 264*d* and a payload field 264*e*. At an appropriate time, linked-list interlineation may be ended (block 270) for that sector. For example, once there are not sufficient remaining update available spaces in the sector to store additional sets of data in sequences of linked-list entries, the linked-list interlineation may be ended (block 270) for that particular sector. However, any remaining sets of data to be stored may be stored in other sectors having sufficient update available spaces.

In this example, the linked-list data structures U2, U3 and U4 need not be contiguous with each other within the sector 74 but instead may be separated by a number of memory locations containing remaining data of the initial set of data of the data structure U1. In this manner, the linked-list data structures U2, U3 and U4 are interspersed with the data of the initial set of data of the data structure U1 as shown in FIG. 5*d*.

Similarly the entries of the linked-list data structures U2, U3 and U4 need not be contiguous with other entries but instead may be separated by a number of memory locations containing remaining data of the initial set of data of the data structure U1. In this manner, the linked-list data structures U2, U3 and U4 and their entries are interspersed with the data of the initial set of data of the data structure U1 as shown in FIG. 5*d*.

Figure 6:
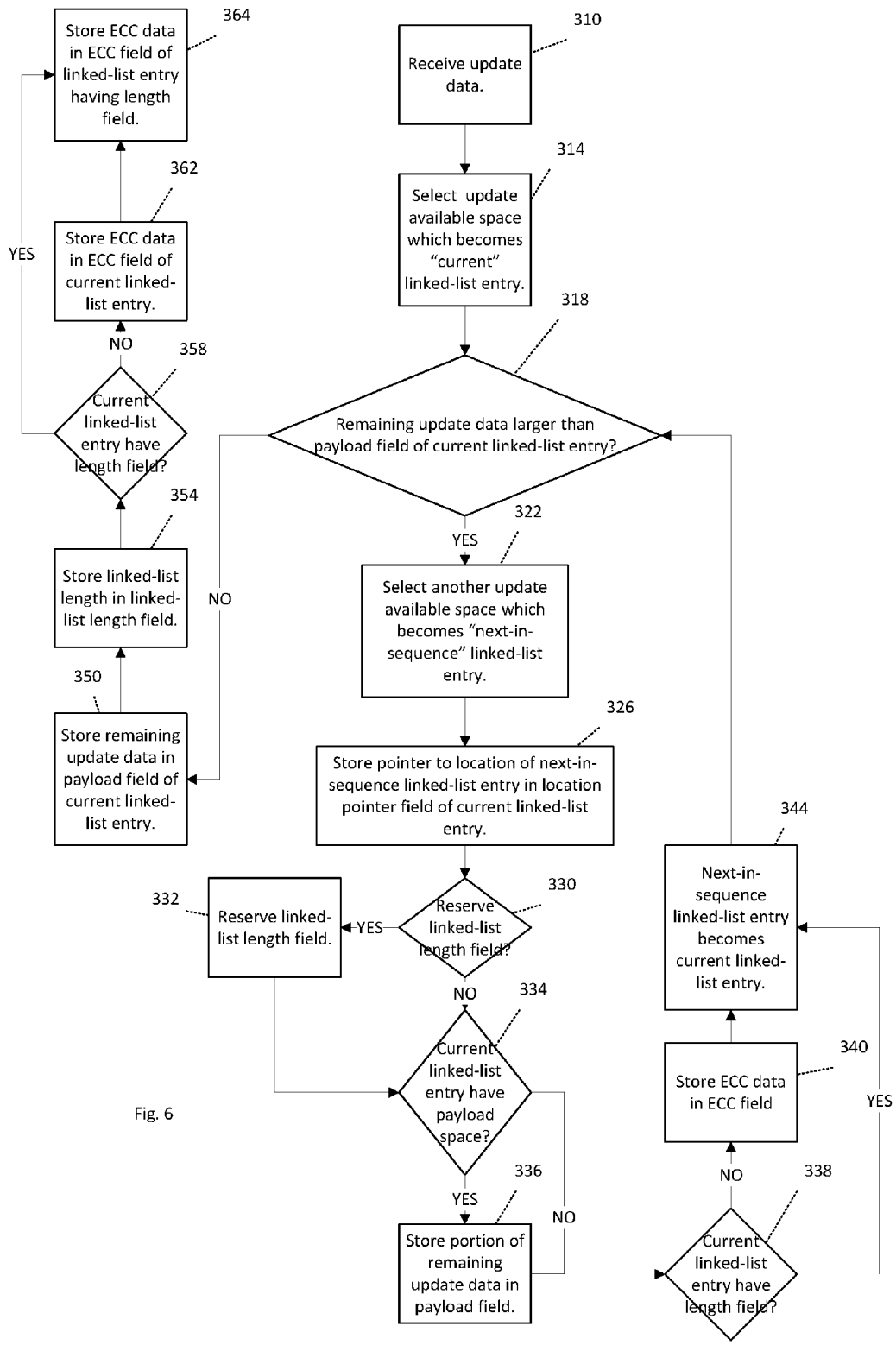
FIG. 6 depicts another embodiment of operations of linked-list interlineation of data in accordance with the present description.

FIG. 6 depicts one example of operations of the linked-list entry generation logic 96 and the data replacement logic 94 (FIG. 2) of the linked-list interlineation logic 86. Upon receipt (block 310, FIG. 6) of update data such as the subsequent set of data which will be stored in the linked-list data structure U2 in this example, the data replacement logic 94 (FIG. 2) is configured to select (block 314) one or more update available spaces for purposes of storing an entry (referred to as the "current" linked-list entry) of a sequence of linked-list entries. In this example, the update available spaces 212*a* (FIG. 5*b*) and 212*b* are selected (block 314, FIG. 6) for purposes of storing the first entry 224*a* (FIG. 5*c*, 5*d*) of the linked-list data structure U2. Also, in this example, the update data of the subsequent set of data is determined (block 318) to be too large for the current entry 224*a* of the data structure U2. Accordingly, the data replacement logic 94 (FIG. 2) is configured to select (block 322, FIG. 6) one or more additional update available spaces for purposes of storing the next-in-sequence linked-list entry which is entry 224*b* (FIG. 5*d*) in this example, of the sequence of linked-list entries of the data structure U2.

The linked-list entry generation logic 96 (FIG. 2) is configured to generate location data pointing to the location of the next-in-sequence entry, which is entry 224*b* (FIG. 5*d*) in this example. The data replacement logic 94 (FIG. 2) is configured to store (block 326) the location data pointing to the location of the next-in-sequence entry, which is entry 224*b* (FIG. 5*d*) in this example, in a pointer location field 228*b* (FIG. 5*d*) of the current linked-list entry which is entry 224*a*, in this example.

As previously mentioned, in one embodiment a sequence length field may be omitted from some entries of the linked-list data structure. Accordingly, he linked-list entry generation logic 96 (FIG. 2) is configured to determine (block 330, FIG. 6) whether a sequence length field is to be reserved for the current linked-list entry being generated and stored. In this example, the current linked-list entry 224*a* (FIG. 5*d*) lacks a sequence length field as shown in FIG. 5*d*. Accordingly, the sequence length field reservation operation (block 332, FIG. 6) is bypassed for the current linked-list entry 224*a*.

As previously mentioned, in one embodiment a payload field may be omitted from some entries of the linked-list data structure. Accordingly, the linked-list entry generation logic 96 (FIG. 2) is configured to determine (block 334, FIG. 6) whether the current linked-list entry is to have a payload field for purposes of storing update data of the subsequent set of data. In this example, the current linked-list entry 224a lacks a payload field as shown in FIG. 5d. Accordingly, the payload data storing operation (block 336, FIG. 6) is bypassed for the current linked-list entry 224a.

Having determined (block 338, FIG. 6) that the current linked-list entry 224a lacks a sequence length field, the ECC data may be calculated by the error correction code logic 90 (FIG. 2) based upon the completed data of the nonheader fields which is the location field 228b (FIG. 5d) of the entry 224a in this example. The data replacement logic 94 (FIG. 2) is configured to store (block 340, FIG. 6) the calculated ECC data for the entry 224a (FIG. 5d) in the ECC header field 228a for the entry 224a and redesignate (block 344) the next-in-sequence linked-list entry, entry 224b in this example, to become the current linked-list entry. Thus, the linked-list entry 224b is now designated the current linked-list entry at this stage of the operations of FIG. 6.

Proceeding with the newly designated current entry 224b, the update data of the subsequent set of data is determined (block 318) to be too large for the payload field which is payload field 228e (FIG. 5d) in this example, of the current linked-list entry 224b of the data structure U2. Accordingly, the data replacement logic 94 (FIG. 2) selects (block 322, FIG. 6) one or more additional update available spaces for purposes of storing the next-in-sequence linked-list entry which is entry 224c (FIG. 5d) in this example.

The linked-list entry generation logic 96 (FIG. 2) generates location data pointing to the location of the next-in-sequence entry, which is entry 224c (FIG. 5d) in this example. The data replacement logic 94 (FIG. 2) stores (block 326) the location data pointing to the location of the next-in-sequence entry, which is entry 224c (FIG. 5d) in this example, in a pointer location field 228f (FIG. 5d) of the current linked-list entry which is entry 224b, in this example.

The linked-list entry generation logic 96 (FIG. 2) determines (block 330, FIG. 6) whether a sequence length field is to be reserved for the current linked-list entry being generated and stored. In this example, the current linked-list entry 224b has a sequence length field, which is sequence length field 228d in this example, as shown in FIG. 5d. Accordingly, the sequence length field 228d is reserved (block 332, FIG. 6) for the current linked-list entry 224b.

The linked-list entry generation logic 96 (FIG. 2) determines (block 334, FIG. 6) whether the current linked-list entry is to have a payload field for purposes of storing update data of the subsequent set of data. In this example, the current linked-list entry 224b has a payload field which is payload field 228e in this example, as shown in FIG. 5d. Accordingly, the data replacement logic 94 (FIG. 2) stores (block 336, FIG. 6) a first portion of the data of the subsequent data set in the payload field which is payload field 228e in this example for the current linked-list entry 224b.

Having determined (block 338, FIG. 6) that the current linked-list entry 224b has reserved a sequence length field, the data replacement logic 94 (FIG. 2) bypasses the ECC data storing operation (block 340) since the sequence length data has not yet been stored in the sequence length field 228d of the current entry 224b in this example. The data replacement logic 94 (FIG. 2) redesignates (block 340) the next-in-sequence linked list entry, entry 224c in this example, to become the current linked-list entry. Thus, the linked-list entry 224c is now designated the current linked-list entry at this stage of the operations of FIG. 6.

Proceeding with the newly designated current entry 224c, the remaining update data of the subsequent set of data is again determined (block 318) to be too large for the payload field which is payload field 228h (FIG. 5d) in this example, of the current linked-list entry 224c of the data structure U2. Accordingly, the data replacement logic 94 (FIG. 2) selects (block 322, FIG. 6) one or more additional update available spaces for purposes of storing the next-in-sequence linked-list entry which is entry 224d (FIG. 5d) in this example.

The linked-list entry generation logic 96 (FIG. 2) generates location data pointing to the location of the next-in-sequence entry, which is entry 224d (FIG. 5d) in this example. The data replacement logic 94 (FIG. 2) stores (block 326) the location data pointing to the location of the next-in-sequence entry, which is entry 224d (FIG. 5d) in this example, in a pointer location field 228i (FIG. 5d) of the current linked-list entry which is entry 224c, in this example.

The linked-list entry generation logic 96 (FIG. 2) determines (block 330, FIG. 6) whether a sequence length field is to be reserved for the current linked-list entry being generated and stored. In this example, the current linked-list entry 224c does not have a sequence length field, and accordingly, a sequence length field is not reserved (block 332, FIG. 6) for the current linked-list entry 224b.

The linked-list entry generation logic 96 (FIG. 2) determines (block 334, FIG. 6) whether the current linked-list entry is to have a payload field for purposes of storing update data of the subsequent set of data. In this example, the current linked-list entry 224c has a payload field which is payload field 228h in this example, as shown in FIG. 5d. Accordingly, the data replacement logic 94 (FIG. 2) stores (block 336, FIG. 6) a second portion of the data of the subsequent data set in the payload field which is payload field 228h in this example for the current linked-list entry 224c.

Having determined (block 338, FIG. 6) that the current linked-list entry 224c lacks a sequence length field, the ECC data may be calculated by the error correction code logic 90 (FIG. 2) based upon the completed data of the nonheader fields which are the payload field 228h and the location field 228i of the entry 224c in this example. The data replacement logic 94 (FIG. 2) is configured to store (block 340, FIG. 6) the calculated ECC data for the entry 224c in the ECC header field 228g for the entry 224c. The data replacement logic 94 (FIG. 2) redesignates (block 340) the next-in-sequence linked list entry, entry 224d in this example, to become the current linked-list entry. Thus, the linked-list entry 224d is now designated the current linked-list entry at this stage of the operations of FIG. 6.

Proceeding with the newly designated current entry 224d, the remaining update data of the subsequent set of data is determined (block 318) to not be too large for the payload field which is payload field 228k (FIG. 5d) in this example, of the current linked-list entry 224d of the data structure U2. Accordingly, current entry 224d is the final entry of the sequence of linked-list entries of the linked-list data structure U2 and the selection (block 322, FIG. 6) of one or more additional update available spaces for purposes of storing a next-in-sequence linked-list entry is bypassed.

In this example, the current linked-list entry 224d has a payload field which is payload field 228k in this example, as shown in FIG. 5d. Accordingly, the data replacement logic 94 (FIG. 2) stores (block 350, FIG. 6) the third and final portion of the data of the subsequent data set in the payload field which is payload field 228k in this example for the current linked-list entry 224d. In addition, the data replacement logic 94 (FIG. 2) stores (block 354, FIG. 6) the length data identifying the total length of the linked-list data structure U2 in the sequence length field which is sequence length field 228d of the entry 224b in this example.

The linked-list entry generation logic 96 (FIG. 2) determines (block 358, FIG. 6) whether the sequence length field is in the current linked-list entry. In this example, the current linked-list entry 224d lacks the sequence length field. Accordingly, the ECC data may be calculated by the error correction code logic 90 (FIG. 2) based upon the completed data of the nonheader fields which is the payload field 228k of the entry 224d in this example. The data replacement logic 94 (FIG. 2) stores (block 362, FIG. 6) the calculated ECC data for the entry 224d in the ECC header field 228j for the entry 224d.

As previously mentioned the second entry 224b of the sequence of linked-list entries for the data structure U2 has the sequence length field 228d in this example. Having stored the length data in the sequence length field 228d, the ECC data may be calculated by the error correction code logic 90 (FIG. 2) based upon the completed data of the nonheader fields which is the sequence length field 228d, the payload field 228e, and the location field 228f of the entry 224b in this example. The data replacement logic 94 (FIG. 2) stores (block 364, FIG. 6) the calculated ECC data for the entry 224b in the ECC header field 228c for the entry 224b. At this point, all entries of the sequence of entries 224a-224d of the data structure U2 storing the data of the subsequent set have been completed and stored in update available spaces of the sector 74. The fields 260a (FIG. 5d), 260b, 260c, 260d and 260e of the linked-list data structure U3 and the 264a, 264b, 264c, 264d and 264e of the linked-list data structure U4 may be placed in the sector 74 in a similar manner. It is appreciated that the field data of the sequence of linked-list entries may be calculated and filled in the fields in any order, depending upon the particular application.

Figure 7:
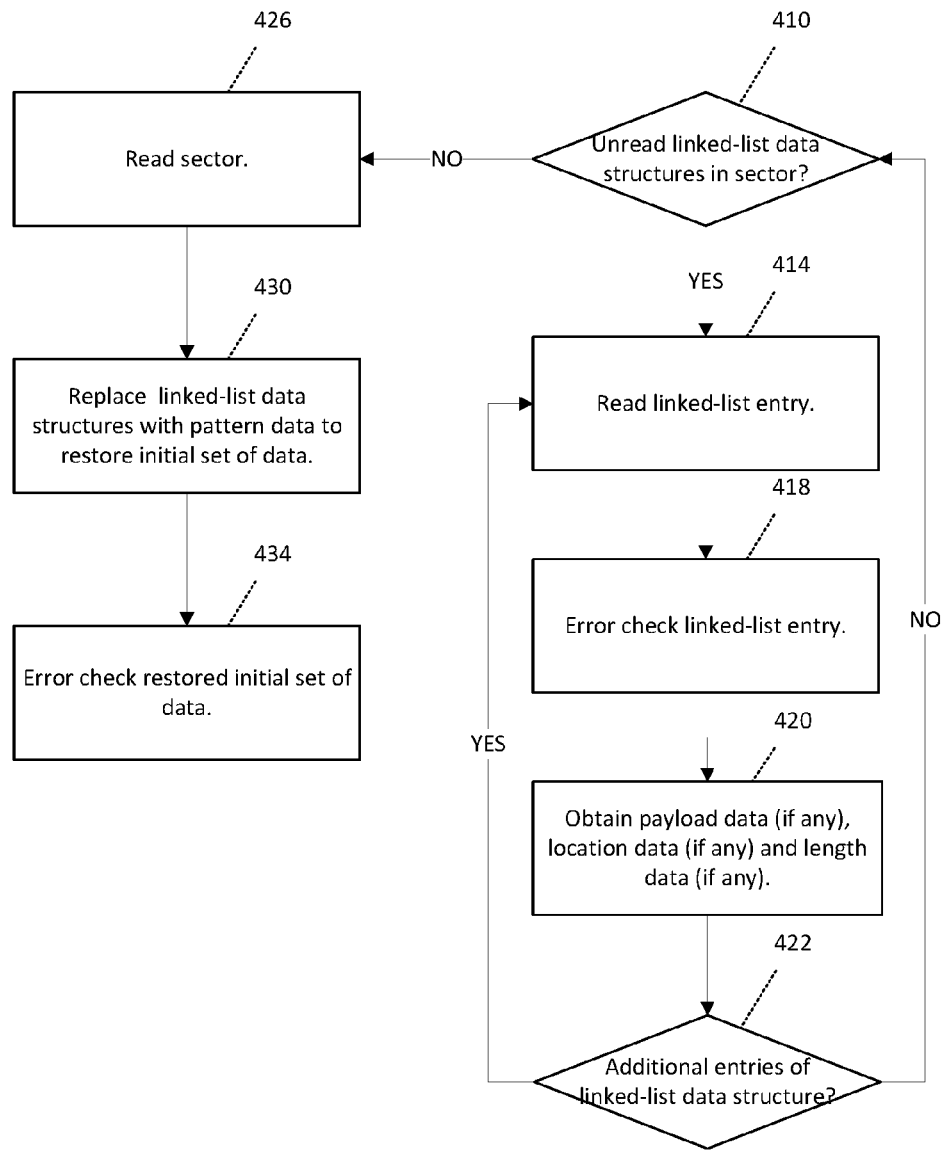
FIG. 7 depicts yet another embodiment of operations of linked-list interlineation of data in accordance with the present description.

FIG. 7 depicts an example of operations of the memory control logic 84 including the linked-list interlineation logic 86 (FIG. 2) which are configured to read from the memory, the subsequent sets of data of the linked-list data structures, as well as the initial set of data of the initial data structure stored in the sector. In this example, the memory control logic 84 reads the linked-list data structures U2, U3, U4 from the sector 74 and also the initial data structure U1 of the sector 74.

Accordingly, if it is determined (block 410, FIG. 7) that the sector being read contains linked-list data structures that have not yet been read, a linked-list entry is read (block 414). In this example, the first linked-list entry read is the entry 224a (FIG. 5d) of the linked-list data structure U2. An initial entry of a sequence of entries of a linked-list data structure may be located within the sector using various techniques as appropriate. For example, a limited section of update available spaces may be reserved within the initial data structure U1 for initial entries of sequences of linked-list data structures. In this embodiment, the update available spaces 212a, 212b, 212c and 212d, for example, have been reserved for initial entries of linked-list data structures. Accordingly, in this example, the first entry 224a (FIG. 5d) of the linked-list data structure U2 is stored in the reserved update available spaces 212a, 212b (FIG. 5b). As a result, the initial entry 224a (FIG. 5d) of the linked-list data structure U2 may be readily located by reading from the reserved spaces. The initial entry 224a (FIG. 5d) of the linked-list data structure U2 is error checked (block 418) in this embodiment using the ECC data stored in the ECC header field 228a of the entry 224a. If an ECC error is detected when reading an entry and the error cannot be corrected, the reading operation of the data structure U2 will be exited in this embodiment without reading the remaining entries of the data structure U2 since it will be deemed that the data of the entries cannot be trusted.

The remaining entry data is obtained (block 420, FIG. 7) from the initial entry 224a (FIG. 5d) of the linked-list data structure U2, including reading payload data (if any), location data (if any), and length data (if any) from the entry. In this example, the initial entry 224a (FIG. 5d) of the linked-list data structure U2 has a location field 228b (in addition to the ECC header field 228a) but lacks a payload field or a sequence length field.

It is determined (block 422, FIG. 7) by the location field 228b that the sequence of linked-list entries of the linked-list data structure U2 has additional entries and therefore the next-in-sequence entry 224b is read (block 414, FIG. 7) using the location data stored in the location field 228b of the entry 224a to locate the next-in-sequence entry 224b. The next-in-sequence entry 224b (FIG. 5d) of the linked-list data structure U2 is error checked (block 418) in this embodiment using the ECC data stored in the ECC field 228c (FIG. 5d) of the entry 224b. Sequence length data, payload data and location data are obtained (block 420, FIG. 7) from the fields 228d (FIG. 5d), 228e, and 228f, respectively of the entry 224b. The remaining entries, 224c, 224d of the sequence of linked-list entries of the linked-list data structure U2 are located, read and error checked in this manner. Reading of the complete sequence of entries 224a-224d of the linked-list data structure U2 may be confirmed by the comparing the sequence length data obtained from the sequence length field 228d to the total number of bytes located in the sequence of entries 224a-224d of the linked-list data structure U2.

The fields of the entries of the sequence of linked-list entries may be delineated using any suitable technique such as field boundary markers, field identity markers, predetermined sizes of fields, predetermined ordering of fields, location tables, etc. depending upon the particular application. For example, in one embodiment, each payload field may contain a length field that indicates the number of bytes in the payload field. FIG. 5e shows an example of the payload field 228e of the entry 224b (FIG. 5d) of the data structure U2, having a payload length field 228e2 (FIG. 5e) which may be used to calculate the location of the location field 228f (FIG. 5d) which is placed after the payload field 228e in this example. Additionally, each payload field may contain one or more sets of location, length or data fields. For example, a payload location field 228e1 (FIG. 5e) of the payload field 228e may contain location data which points to where data is to be placed within the initial data set. A payload length field 228e2 described above indicates the length of data to be inserted, and a payload data field 228e3 contains received data of the update data. In this example, it is determined (block 410, FIG. 7) that the sector being read contains additional linked-list data structures that have not yet been read, that is, linked-list data structures U3 (FIG. 5d) and U4. Accordingly, the sequence of entries 250a-250b of the linked-list data structure U3 and the sequence of entries 254a-254b of the linked-list data structure U4 are read in a manner similar to that described above in connection with the sequence of entries 224a-224d of the linked-list data structure U2. The sets of update data which were stored as payload data in linked-list data structures U2, U3, U4 may be utilized as appropriate by the system.

In this example, the initial entry 250a of the linked-list data structure U3 is located by its placement immediately after the last entry 224d of the sequence of entries of the linked-list data structure U2. The initial entry 254a of the linked-list data structure U4 is located by its placement in the reserved update available spaces 212c, 212d (FIG. 5b). It is appreciated that sequences of linked-list entries may be located within a data structure such as the data structure U1, using other techniques depending upon the particular application. For example, a table may be used to identify locations of one or more entries of linked-list data structures. In another embodiment, a flag bit may be inserted in the last entry of a data structure to indicate whether that entry is followed by an entry of another update data structure. For example, the last entry 224d (FIG. 5d) of the linked-list data structure U2 may include a flag bit to indicate when set, that the memory control logic reading the sector should examine the memory locations following the entry 224d to determine if those memory locations contain an entry of another linked-list data structure or are empty, that is, are an update available space. In the example of FIG. 5d, a flag bit set in the last entry 224d of the linked-list data structure U2 indicates that the memory control logic examining the memory locations following the entry 224d would determine that those memory locations contain the entry 250a of the linked-list data structure U3. Once all the linked-list data structures U2, U3, U4 have been read such that it is determined (block 410) that there are no linked-list data structures remaining unread, the sector may be read (block 426) into a memory such as a buffer, for example, to recover the initial set of data of the initial data structure U1 stored in the data field 201 (FIG. 5a). Accordingly, the linked-list data structures U2, U3, U4 in the buffer are replaced (block 430, FIG. 7) with the first pattern of data which is the 0xFF pattern in this example. As a result, the initial set of data stored in the data field 201 is restored to its original state prior to the linked-list interlineation of the data structures U2, U3, U4 which were embedded the initial data structure U1. Accordingly, the initial error correction code stored in the ECC field 204 of the initial data structure U1 may be used to error check (block 434) the initial data of the data field 201. In this manner, the initial set of data stored in the data field 201 is made available to be utilized as appropriate by the system.

It is appreciated that when reading the sector and retrieving the linked-list data structures, a snapshot of the data may be obtained at different time instances in those instances in which the updates are obtained at different times. For example, after the initial set of data is stored as the data structure U1, a second update stored in the data structure U2 is subsequently applied on top of the initial set of data of the data structure U1, and a third update stored in a data structure U3 is subsequently applied on top of the data structure U2. Such an arrangement may represent, for example, different temperature measurements at different times by a temperature sensor.

EXAMPLES

The following examples pertain to further embodiments.
Example 1 is an apparatus, comprising:
a memory having memory locations configured to store data in data structures, and
memory control logic configured to control input/output operations to the memory wherein the memory control logic is further configured to store an initial set of data which includes at least a first pattern of data, in an initial data structure having an initial set of memory locations of the memory, and wherein the memory control logic includes linked-list interlineation logic configured to, after the memory control logic stores the initial set of data, store a subsequent set of data in a linked-list data structure within the initial data structure, the linked-list data structure having a subset of the initial set of memory locations and a sequence of linked-list entries stored in the subset of the initial set of memory locations, wherein the linked-list interlineation logic includes pattern recognition logic configured to identify a subset of memory locations within the initial set of memory locations of the initial data structure, as a function of at least the first pattern of data wherein the memory locations of the subset of memory locations are interspersed with other memory locations of the initial set of memory locations, and, data replacement logic configured to replace the first pattern of data stored in a memory location of the subset of memory locations with data of the subsequent set of data, to store in the subset of memory locations, the subsequent set of data in a linked-list data structure in a sequence of linked-list entries of the linked-list data structure.

In Example 2, the subject matter of Examples 1-7 (excluding the present Example), can optionally include wherein the initial data structure includes an error correction code field and wherein the memory control logic includes error correction code logic configured to calculate for the initial set of data, first error correction code data, the memory control logic being configured to store a calculated first error correction code data in the error correction code field of the initial data structure, the error correction code logic being further configured to detect and correct storage errors in the initial set of data as a function of the first error correction code data, and wherein the error correction code logic is further configured to calculate for the subsequent set of data, second error correction code data, the memory control logic being configured to store in the sequence of linked-list entries, second error correction code data after the first error correction code data is stored, the error correction code logic being further configured to detect and correct storage errors in the subsequent set of data as a function of the second error correction code data.

In Example 3, the subject matter of Examples 1-7 (excluding the present Example), can optionally include wherein the linked-list interlineation logic includes linked-list entry generation logic configured to generate the sequence of linked-list entries which includes a first linked-list entry and a second, next-in-sequence entry with respect to the first linked-list entry of the sequence of linked-list entries, and wherein each linked-list entry has a header field and wherein the data replacement logic is further configured to store entry error correction code data of the second error correction code data, in a header field in each of the first linked-list entry and the second, next-in-sequence entry, wherein the first linked-list entry has a pointer location field and wherein the data replacement logic is further configured to store within the subsequent set of data, location data in a pointer location field of the first linked-list entry wherein the location data points to the location of the second, next-in-sequence linked-list entry of the sequence of linked-list entries within the memory, and wherein at least one of the first linked-list entry and the next-in-sequence entry, has a payload field, and a sequence length field and wherein the data replacement logic is further configured to store within the subsequent set of data, payload data in a payload field, and sequence length data in a sequence length field wherein the sequence length data identifies a total length of the sequence of linked-list entries.

In Example 4, the subject matter of Examples 1-7 (excluding the present Example), can optionally include wherein the linked-list interlineation logic is further configured to read from the memory, the subsequent set of data of the sequence of linked-list entries, and remaining data of the initial set of data, and the data replacement logic is further configured to replace the subsequent set of data with the first pattern of data, to restore the initial set of data to provide a restored initial set of data.

In Example 5, the subject matter of Examples 1-7 (excluding the present Example), can optionally include wherein the linked-list interlineation logic configured to read from the memory, the subsequent set of data of the sequence of linked-list entries, is further configured to:

read location data stored in a pointer location field of the first linked-list entry to identify the location of the second, next-in-sequence linked-list entry of the sequence of linked-list entries within the memory, read payload data stored in a payload field of an entry of the sequence of linked-list entries, read entry error correction code data stored in a header field in each of the first linked-list entry and the second, next-in-sequence entry, and read sequence length data in a sequence length field and determine based upon the sequence length data whether a complete sequence of linked-list entries has been read from the memory, and wherein the error correction code logic configured to detect and correct storage errors in the subsequent set of data is further configured to error detect and correct data of the first linked-list entry and the second, next-in-sequence entry, as a function of the entry error correction code data stored in a header field in each of the first linked-list entry and the second, next-in-sequence entry, respectively.

In Example 6, the subject matter of Examples 1-7 (excluding the present Example), can optionally include wherein the memory is a non-volatile flash memory having an erasable block of non-volatile memory, wherein the memory control logic includes block erase logic configured to change all bits of an erasable block to a common bit state to erase an erasable block of the non-volatile flash memory wherein an erasable block is the smallest unit of the non-volatile memory capable of being erased at a time, wherein the first pattern is a string of bits which are exclusively of the common bit state, wherein the initial set of memory locations is a sector of the memory, and wherein the initial data structure fills the sector.

In Example 7, the subject matter of Examples 1-7 (excluding the present Example), can optionally include at least one of:

a processor;

a display communicatively coupled to the processor, a network interface communicatively coupled to the processor, and a battery coupled to provide power to the apparatus.

Example 8 is a method, comprising:

storing an initial set of data in an initial data structure having an initial set of memory locations of a memory, and storing a subsequent set of data in a linked-list data structure within the initial data structure, the linked-list data structure having a subset of the initial set of memory locations and a sequence of linked-list entries stored in the subset of the initial set of memory locations, the storing a subsequent set of data including:

identifying a subset of memory locations within the initial set of memory locations, wherein the subset of memory locations store a first pattern of data wherein the memory locations of the subset of memory locations are interspersed with other memory locations of the initial set of memory locations storing the initial set of data, and replacing the first pattern of data stored in a memory location of the subset of memory locations with data of the subsequent set of data, said replacing including storing in the subset of memory locations, the subsequent set of data in a linked-list data structure in a sequence of linked-list entries of the linked-list data structure.

In Example 9, the subject matter of Examples 8-16 (excluding the present Example), can optionally include wherein the storing an initial set of data includes storing first error correction code data configured for detecting and correcting storage errors in the initial set of data, and wherein the storing a subsequent set of data includes storing second error correction code data after storing the initial set of data including the first error correction code data, the second error correction code data being configured for detecting and correcting storage errors in the subsequent set of data.

In Example 10, the subject matter of Examples 8-16 (excluding the present Example), can optionally include wherein the sequence of linked-list entries includes a first linked-list entry and a second, next-in-sequence entry with respect to the first linked-list entry of the sequence of linked-list entries, and wherein storing second error correction code data includes storing entry error correction code data in a header field in each of the first linked-list entry and the second, next-in-sequence entry.

In Example 11, the subject matter of Examples 8-16 (excluding the present Example), can optionally include wherein the storing a subsequent set of data includes storing location data in a pointer location field of the first linked-list entry wherein the location data points to the location of the second, next-in-sequence linked-list entry of the sequence of linked-list entries within the memory.

In Example 12, the subject matter of Examples 8-16 (excluding the present Example), can optionally include wherein the storing a subsequent set of data includes storing in at least one of the first linked-list entry and the second, next-in-sequence entry, payload data in a payload field, and sequence length data in a sequence length field wherein the sequence length data identifies a total length of the sequence of linked-list entries.

In Example 13, the subject matter of Examples 8-16 (excluding the present Example), can optionally include:

reading from the memory, the subsequent set of data of the sequence of linked-list entries, and remaining data of the initial set of data, and restoring the initial set of data to provide a restored initial set of data, said restoring including replacing the sequence of linked-list entries with the first pattern of data.

In Example 14, the subject matter of Examples 8-16 (excluding the present Example), can optionally include error checking the subsequent set of data of the sequence of linked-list entries read from the memory using the second error correction code data, and error checking the restored initial set of data read using the first error correction code data.

In Example 15, the subject matter of Examples 8-16 (excluding the present Example), can optionally include wherein the reading from the memory, the subsequent set of data of the sequence of linked-list entries, includes:

reading location data stored in a pointer location field of the first linked-list entry to identify the location of the second, next-in-sequence linked-list entry of the sequence of linked-list entries within the memory, reading payload data stored in a payload field of an entry of the sequence of linked-list entries, reading entry error correction code data in stored in a header field in each of the first linked-list entry and the second, next-in-sequence entry, and reading sequence length data in a sequence length field and determining based upon the sequence length data whether a complete sequence of linked-list entries has been read from the memory, and wherein the error checking the subsequent set of data of the sequence of linked-list entries read from the memory using the second error correction code data, includes error checking data of the first linked-list entry and the second, next-in-sequence entry, using the entry error correction code data stored in a header field in each of the first linked-list entry and the second, next-in-sequence entry, respectively.

In Example 16, the subject matter of Examples 8-16 (excluding the present Example), can optionally include wherein the memory is a non-volatile flash memory having an erasable block of non-volatile memory wherein the erasable block is the smallest unit of the non-volatile memory capable of being erased at a time, the method further comprising erasing a block of the non-volatile flash memory, the erasing including changing all bits of the block being erased to a common bit state wherein the first pattern is a string of bits which are exclusively of the common bit state, wherein the initial set of memory locations is a sector of the memory, and wherein the initial set of data fills the sector.

Example 17 is an apparatus for memory comprising means to perform a method as claimed in any preceding claim.

Example 18 is a computer program product for use with a memory having memory locations configured to store data in data structures, wherein the computer program product comprises a computer readable storage medium having program instructions embodied therewith, the program instructions executable by a processor to cause processor operations, the processor operations comprising:

controlling input/output operations to the memory including storing an initial set of data which includes at least a first pattern of data, in an initial data structure having an initial set of memory locations of the memory: and after storing the initial set of data, storing a subsequent set of data in a linked-list data structure within the initial data structure, the linked-list data structure having a subset of the initial set of memory locations and a sequence of linked-list entries stored in the subset of the initial set of memory locations, wherein storing a subsequent set of data includes:

identifying a subset of memory locations within the initial set of memory locations of the initial data structure, as a function of at least the first pattern of data wherein the memory locations of the subset of memory locations are interspersed with other memory locations of the initial set of memory locations, and, replacing the first pattern of data stored in a memory location of the subset of memory locations with data of the subsequent set of data, to store in the subset of memory locations, the subsequent set of data in a linked-list data structure in a sequence of linked-list entries of the linked-list data structure.

In Example 19, the subject matter of Examples 18-26 (excluding the present Example), can optionally include wherein the initial data structure includes an error correction code field and wherein storing an initial set of data further includes calculating for the initial set of data, first error correction code data, and storing a calculated first error correction code data in the error correction code field of the initial data structure, and wherein storing a subsequent set of data further includes calculating for the subsequent set of data, second error correction code data, and storing in the sequence of linked-list entries, second error correction code data after the first error correction code data is stored, and wherein the processor operations further comprise detecting and correcting storage errors in the initial set of data as a function of the first error correction code data, and detecting and correcting storage errors in the subsequent set of data as a function of the second error correction code data.

In Example 20, the subject matter of Examples 18-26 (excluding the present Example), can optionally include wherein storing a subsequent set of data further includes generating the sequence of linked-list entries which includes a first linked-list entry and a second, next-in-sequence entry with respect to the first linked-list entry of the sequence of linked-list entries, and wherein each linked-list entry has a header field and wherein replacing the first pattern of data includes storing entry error correction code data of the second error correction code data, in a header field in each of the first linked-list entry and the second, next-in-sequence entry.

In Example 21, the subject matter of Examples 18-26 (excluding the present Example), can optionally include wherein the first linked-list entry has a pointer location field and wherein replacing the first pattern of data includes storing within the subsequent set of data, location data in a pointer location field of the first linked-list entry wherein the location data points to the location of the second, next-in-sequence linked-list entry of the sequence of linked-list entries within the memory.

In Example 22, the subject matter of Examples 18-26 (excluding the present Example), can optionally include wherein at least one of the first linked-list entry and the next-in-sequence entry, has a payload field, and a sequence length field and wherein replacing the first pattern of data includes storing within the subsequent set of data, payload data in a payload field, and sequence length data in a sequence length field wherein the sequence length data identifies a total length of the sequence of linked-list entries.

In Example 23, the subject matter of Examples 18-26 (excluding the present Example), can optionally include wherein the processor operations further comprise reading from the memory, the subsequent set of data of the sequence of linked-list entries, and remaining data of the initial set of data, and replacing the subsequent set of data with the first pattern of data, to restore the initial set of data to provide a restored initial set of data.

In Example 24, the subject matter of Examples 18-26 (excluding the present Example), can optionally include wherein the reading from the memory, the subsequent set of data of the sequence of linked-list entries further includes:

reading location data stored in a pointer location field of the first linked-list entry to identify the location of the second, next-in-sequence linked-list entry of the sequence of linked-list entries within the memory, reading payload data stored in a payload field of an entry of the sequence of linked-list entries, and reading entry error correction code data stored in a header field in each of the first linked-list entry and the second, next-in-sequence entry.

In Example 25, the subject matter of Examples 18-26 (excluding the present Example), can optionally include wherein detecting and correcting storage errors in the subsequent set of data further includes detecting and correcting data of the first linked-list entry and the second, next-in-sequence entry, as a function of the entry error correction code data stored in a header field in each of the first linked-list entry and the second, next-in-sequence entry, respectively.

In Example 26, the subject matter of Examples 18-26 (excluding the present Example), can optionally include wherein the memory is a non-volatile flash memory having an erasable block of non-volatile memory, and wherein the processor operations further comprise changing all bits of an erasable block to a common bit state to erase an erasable block of the non-volatile flash memory wherein an erasable block is the smallest unit of the non-volatile memory capable of being erased at a time, wherein the first pattern is a string of bits which are exclusively of the common bit state, wherein the initial set of memory locations is a sector of the memory, and wherein the initial data structure fills the sector.

Example 27 is an apparatus, comprising:
a processor,
a memory coupled to the processor and having memory locations configured to store data in data structures, and
memory control logic means coupled to the processor and configured for controlling input/output operations to the memory wherein the memory control logic means is further configured for storing an initial set of data which includes at least a first pattern of data, in an initial data structure having an initial set of memory locations of the memory, and wherein the memory control logic means includes linked-list interlineation logic means configured for, after the memory control logic means stores the initial set of data, storing a subsequent set of data in a linked-list data structure within the initial data structure, the linked-list data structure having a subset of the initial set of memory locations and a sequence of linked-list entries stored in the subset of the initial set of memory locations, wherein the linked-list interlineation logic means includes pattern recognition logic means configured for identifying a subset of memory locations within the initial set of memory locations of the initial data structure, as a function of at least the first pattern of data wherein the memory locations of the subset of memory locations are interspersed with other memory locations of the initial set of memory locations, and, data replacement logic means configured for replacing the first pattern of data stored in a memory location of the subset of memory locations with data of the subsequent set of data, to store in the subset of memory locations, the subsequent set of data in a linked-list data structure in a sequence of linked-list entries of the linked-list data structure.

In Example 28, the subject matter of Examples 27-33 (excluding the present Example), can optionally include wherein the initial data structure includes an error correction code field and wherein the memory control logic means includes error correction code logic means configured for calculating for the initial set of data, first error correction code data, the memory control logic means being configured for storing a calculated first error correction code data in the error correction code field of the initial data structure, the error correction code logic means being further configured for detecting and correcting storage errors in the initial set of data as a function of the first error correction code data, and wherein the error correction code logic means is further configured for calculating for the subsequent set of data, second error correction code data, the memory control logic means being configured for storing in the sequence of linked-list entries, second error correction code data after the first error correction code data is stored, the error correction code logic means being further configured for detecting and correcting storage errors in the subsequent set of data as a function of the second error correction code data.

In Example 29, the subject matter of Examples 27-33 (excluding the present Example), can optionally include wherein the linked-list interlineation logic means includes linked-list entry generation logic means configured for generating the sequence of linked-list entries which includes a first linked-list entry and a second, next-in-sequence entry with respect to the first linked-list entry of the sequence of linked-list entries, and wherein each linked-list entry has a header field and wherein the data replacement logic means is further configured for storing entry error correction code data of the second error correction code data, in a header field in each of the first linked-list entry and the second, next-in-sequence entry, wherein the first linked-list entry has a pointer location field and wherein the data replacement logic means is further configured for storing within the subsequent set of data, location data in a pointer location field of the first linked-list entry wherein the location data points to the location of the second, next-in-sequence linked-list entry of the sequence of linked-list entries within the memory, and wherein at least one of the first linked-list entry and the next-in-sequence entry, has a payload field, and a sequence length field and wherein the data replacement logic means is further configured for storing within the subsequent set of data, payload data in a payload field, and sequence length data in a sequence length field wherein the sequence length data identifies a total length of the sequence of linked-list entries.

In Example 30, the subject matter of Examples 27-33 (excluding the present Example), can optionally include wherein the linked-list interlineation logic means is further configured for reading from the memory, the subsequent set of data of the sequence of linked-list entries, and remaining data of the initial set of data, and the data replacement logic means is further configured for replacing the subsequent set of data with the first pattern of data, to restore the initial set of data to provide a restored initial set of data.

In Example 31, the subject matter of Examples 27-33 (excluding the present Example), can optionally include wherein the linked-list interlineation logic means configured for reading from the memory, the subsequent set of data of the sequence of linked-list entries, is further configured for:

reading location data stored in a pointer location field of the first linked-list entry to identify the location of the second, next-in-sequence linked-list entry of the sequence of linked-list entries within the memory, reading payload data stored in a payload field of an entry of the sequence of linked-list entries, reading entry error correction code data stored in a header field in each of the first linked-list entry and the second, next-in-sequence entry, and reading sequence length data in a sequence length field and determine based upon the sequence length data whether a complete sequence of linked-list entries has been read from the memory, and wherein the error correction code logic means configured for detecting and correcting storage errors in the subsequent set of data is further configured for detecting and correcting data of the first linked-list entry and the second, next-in-sequence entry, as a function of the entry error correction code data stored in a header field in each of the first linked-list entry and the second, next-in-sequence entry, respectively.

In Example 32, the subject matter of Examples 27-33 (excluding the present Example), can optionally include wherein the memory is a non-volatile flash memory having an erasable block of non-volatile memory, wherein the memory control logic means includes block erase logic means configured for changing all bits of an erasable block to a common bit state to erase an erasable block of the non-volatile flash memory wherein an erasable block is the smallest unit of the non-volatile memory capable of being erased at a time, wherein the first pattern is a string of bits which are exclusively of the common bit state, wherein the initial set of memory locations is a sector of the memory, and wherein the initial data structure fills the sector.

In Example 33, the subject matter of Examples 27-33 (excluding the present Example), can optionally include at least one of:

a display communicatively coupled to the processor, a network interface communicatively coupled to the processor, and a battery coupled to provide power to the apparatus.

The described operations may be implemented as a method, apparatus or computer program product using standard programming and/or engineering techniques to produce software, firmware, hardware, or any combination thereof. The described operations may be implemented as computer program code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmissions signals. Those skilled in the art will recognize that many modifications may be made to this configuration without departing from the scope of the present description, and that the article of manufacture may comprise suitable information bearing medium known in the art. Of course, those skilled in the art will recognize that many modifications may be made to this configuration without departing from the scope of the present description, and that the article of manufacture may comprise any tangible information bearing medium known in the art.

In certain applications, a device in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the device embodiments may be embodied in a computing device that does not include, for example, a video controller, such as a switch, router, etc., or does not include a network controller, for example.

The illustrated logic of figures may show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to limit to the precise form disclosed. Many modifications and variations are possible in light of the above teaching.

What is claimed is:

1. An apparatus, comprising:

a memory having memory locations configured to store data in data structures; and memory control logic configured to control input/output operations to the memory wherein the memory control logic is further configured to store an initial set of data which includes at least a first pattern of bit states of data, in an initial data structure having an initial set of memory locations of the memory, and wherein the memory control logic includes linked-list interlineation logic configured to, after the memory control logic stores the initial set of data, store a subsequent set of data in a linked-list data structure within the initial data structure, the linked-list data structure having a subset of the initial set of memory locations and a sequence of linked-list entries stored in the subset of the initial set of memory locations, wherein the linked-list interlineation logic includes pattern recognition logic configured to identify a subset of memory locations within the initial set of memory locations of the initial data structure, as a function of at least the first pattern of bit states of data wherein the memory locations of the identified subset of memory locations are interspersed with other memory locations of the initial set of memory locations; and, data replacement logic configured to replace the first pattern of bit states of data stored in a memory location of the identified subset of memory locations within the initial set of memory locations, with data of the subsequent set of data, to store in the identified subset of memory locations within the initial set of memory locations, the subsequent set of data in a linked-list data structure in a sequence of linked-list entries of the linked-list data structure.

2. The apparatus of claim 1, wherein the initial data structure includes an error correction code field and wherein the memory control logic includes error correction code logic configured to calculate for the initial set of data, first error correction code data, the memory control logic being configured to store a calculated first error correction code data in the error correction code field of the initial data structure, the error correction code logic being further configured to detect and correct storage errors in the initial set of data as a function of the first error correction code data; and wherein the error correction code logic is further configured to calculate for the subsequent set of data, second error correction code data, the memory control logic being configured to store in the sequence of linked-list entries, second error correction code data after the first error correction code data is stored, the error correction code logic being further configured to detect and correct storage errors in the subsequent set of data as a function of the second error correction code data.

3. The apparatus of claim 2 wherein the linked-list interlineation logic includes linked-list entry generation logic configured to generate the sequence of linked-list entries which includes a first linked-list entry and a second, next-in-sequence entry with respect to the first linked-list entry of the sequence of linked-list entries, and wherein each linked-list entry has a header field and wherein the data replacement logic is further configured to store entry error correction code data of the second error correction code data, in a header field in each of the first linked-list entry and the second, next-in-sequence entry;

wherein the first linked-list entry has a pointer location field and wherein the data replacement logic is further configured to store within the subsequent set of data, location data in a pointer location field of the first linked-list entry wherein the location data points to the location of the second, next-in-sequence linked-list entry of the sequence of linked-list entries within the memory; and wherein at least one of the first linked-list entry and the next-in-sequence entry, has a payload field, and a sequence length field and wherein the data replacement logic is further configured to store within the subsequent set of data, payload data in a payload field, and sequence length data in a sequence length field wherein the sequence length data identifies a total length of the sequence of linked-list entries.

4. The apparatus of claim 3 wherein the linked-list interlineation logic is further configured to:

read from the memory, the subsequent set of data of the sequence of linked-list entries, and remaining data of the initial set of data; and the data replacement logic is further configured to replace the subsequent set of data with the first pattern of data, to restore the initial set of data to provide a restored initial set of data.

5. The apparatus of claim 4 wherein the linked-list interlineation logic configured to read from the memory, the subsequent set of data of the sequence of linked-list entries, is further configured to:

read location data stored in a pointer location field of the first linked-list entry to identify the location of the second, next-in-sequence linked-list entry of the sequence of linked-list entries within the memory;

read payload data stored in a payload field of an entry of the sequence of linked-list entries;

read entry error correction code data stored in a header field in each of the first linked-list entry and the second, next-in-sequence entry; and read sequence length data in a sequence length field and determine based upon the sequence length data whether a complete sequence of linked-list entries has been read from the memory; and wherein the error correction code logic configured to detect and correct storage errors in the subsequent set of data is further configured to error detect and correct data of the first linked-list entry and the second, next-in-sequence entry, as a function of the entry error correction code data stored in a header field in each of the first linked-list entry and the second, next-in-sequence entry, respectively.

6. The apparatus of claim 1 wherein the memory is a non-volatile flash memory having an erasable block of non-volatile memory, wherein the memory control logic includes block erase logic configured to change all bits of an erasable block to a common bit state to erase an erasable block of the non-volatile flash memory wherein an erasable block is the smallest unit of the non-volatile memory capable of being erased at a time, wherein the first pattern is a string of bits which are exclusively of the common bit state, wherein the initial set of memory locations is a sector of the memory, and wherein the initial data structure fills the sector.

7. The apparatus of claim 1 further comprising at least one of:

a processor:

a display communicatively coupled to the processor;

a network interface communicatively coupled to the processor; and a battery coupled to provide power to the apparatus.

8. A method, comprising:

storing an initial set of data in an initial data structure having an initial set of memory locations of a memory; and storing a subsequent set of data in a linked-list data structure within the initial data structure, the linked-list data structure having a subset of the initial set of memory locations and a sequence of linked-list entries stored in the subset of the initial set of memory locations, the storing a subsequent set of data including:

identifying a subset of memory locations within the initial set of memory locations, wherein memory locations of the identified subset of memory locations each store a first pattern of bit states of data and wherein the memory locations of the identified subset of memory locations are interspersed with other memory locations of the initial set of memory locations storing the initial set of data; and replacing the first pattern of bit states of data stored in a memory location of the identified subset of memory locations within the initial set of memory locations, with data of the subsequent set of data, said replacing including storing in the identified subset of memory locations within the initial set of memory locations, the subsequent set of data in a linked-list data structure in a sequence of linked-list entries of the linked-list data structure.

9. The method of claim 8, wherein the storing an initial set of data includes storing first error correction code data configured for detecting and correcting storage errors in the initial set of data; and wherein the storing a subsequent set of data includes storing second error correction code data after storing the initial set of data including the first error correction code data, the second error correction code data being configured for detecting and correcting storage errors in the subsequent set of data.

10. The method of claim 9 wherein the sequence of linked-list entries includes a first linked-list entry and a second, next-in-sequence entry with respect to the first linked-list entry of the sequence of linked-list entries, and wherein storing second error correction code data includes storing entry error correction code data in a header field in each of the first linked-list entry and the second, next-in-sequence entry.

11. The method of claim 10 wherein the storing a subsequent set of data includes storing location data in a pointer location field of the first linked-list entry wherein the location data points to the location of the second, next-in-sequence linked-list entry of the sequence of linked-list entries within the memory.

12. The method of claim 11 wherein the storing a subsequent set of data includes storing in at least one of the first linked-list entry and the second, next-in-sequence entry, payload data in a payload field, and sequence length data in a sequence length field wherein the sequence length data identifies a total length of the sequence of linked-list entries.

13. The method of claim 12 further comprising:
reading from the memory, the subsequent set of data of the sequence of linked-list entries, and remaining data of the initial set of data; and
restoring the initial set of data to provide a restored initial set of data, said restoring including replacing the sequence of linked-list entries with the first pattern of data.

14. The method of claim 13 further comprising error checking the subsequent set of data of the sequence of linked-list entries read from the memory using the second error correction code data; and error checking the restored initial set of data read using the first error correction code data.

15. The method of claim 14 wherein the reading from the memory, the subsequent set of data of the sequence of linked-list entries, includes:
reading location data stored in a pointer location field of the first linked-list entry to identify the location of the second, next-in-sequence linked-list entry of the sequence of linked-list entries within the memory;
reading payload data stored in a payload field of an entry of the sequence of linked-list entries;
reading entry error correction code data stored in a header field in each of the first linked-list entry and the second, next-in-sequence entry; and
reading sequence length data in a sequence length field and determining based upon the sequence length data whether a complete sequence of linked-list entries has been read from the memory; and
wherein the error checking the subsequent set of data of the sequence of linked-list entries read from the memory using the second error correction code data, includes error checking data of the first linked-list entry and the second, next-in-sequence entry, using the entry error correction code data stored in a header field in each of the first linked-list entry and the second, next-in-sequence entry, respectively.

16. The method of claim 8 wherein the memory is a non-volatile flash memory having an erasable block of non-volatile memory wherein the erasable block is the smallest unit of the non-volatile memory capable of being erased at a time, the method further comprising erasing a block of the non-volatile flash memory, the erasing including changing all bits of the block being erased to a common bit state wherein the first pattern is a string of bits which are exclusively of the common bit state, wherein the initial set of memory locations is a sector of the memory, and wherein the initial set of data fills the sector.

17. A computer program product for use with a memory having memory locations configured to store data in data structures, wherein the computer program product comprises a non-transitory computer readable storage medium having program instructions embodied therewith, the program instructions executable by a processor to cause processor operations, the processor operations comprising:
controlling input/output operations to the memory including storing an initial set of data which includes at least a first pattern of bit states of data, in an initial data structure having an initial set of memory locations of the memory; and
after storing the initial set of data, storing a subsequent set of data in a linked-list data structure within the initial data structure, the linked-list data structure having a subset of the initial set of memory locations and a sequence of linked-list entries stored in the subset of the initial set of memory locations, wherein storing a subsequent set of data includes:
identifying a subset of memory locations within the initial set of memory locations of the initial data structure, as a function of at least the first pattern of bit states of data wherein the memory locations of the identified subset of memory locations are interspersed with other memory locations of the initial set of memory locations; and,
replacing the first pattern of bit states of data stored in a memory location of the identified subset of memory locations within the initial set of memory locations, with data of the subsequent set of data, to store in the identified subset of memory locations within the initial set of memory locations, the subsequent set of data in a linked-list data structure in a sequence of linked-list entries of the linked-list data structure.

18. The computer program product of claim 17, wherein the initial data structure includes an error correction code field and wherein storing an initial set of data further includes calculating for the initial set of data, first error correction code data, and storing a calculated first error correction code data in the error correction code field of the initial data structure; and wherein storing a subsequent set of data further includes calculating for the subsequent set of data, second error correction code data, and storing in the sequence of linked-list entries, the second error correction code data after the first error correction code data is stored; and wherein the processor operations further comprise detecting and correcting storage errors in the initial set of data as a function of the first error correction code data; and detecting and correcting storage errors in the subsequent set of data as a function of the second error correction code data.

19. The computer program product of claim 18 wherein storing a subsequent set of data further includes generating the sequence of linked-list entries which includes a first linked-list entry and a second, next-in-sequence entry with respect to the first linked-list entry of the sequence of linked-list entries, and wherein each linked-list entry has a header field and wherein replacing the first pattern of data includes storing entry error correction code data of the second error correction code data, in a header field in each of the first linked-list entry and the second, next-in-sequence entry.

20. The computer program product of claim 19 wherein the first linked-list entry has a pointer location field and wherein replacing the first pattern of data includes storing within the subsequent set of data, location data in a pointer location field of the first linked-list entry wherein the location data points to the location of the second, next-in-sequence linked-list entry of the sequence of linked-list entries within the memory.

21. The computer program product of claim 20 wherein at least one of the first linked-list entry and the next-in-sequence entry, has a payload field, and a sequence length field and wherein replacing the first pattern of data includes storing within the subsequent set of data, payload data in a payload field, and sequence length data in a sequence length field wherein the sequence length data identifies a total length of the sequence of linked-list entries.

22. The computer program product of claim 21 wherein the processor operations further comprise reading from the memory, the subsequent set of data of the sequence of linked-list entries, and remaining data of the initial set of data; and replacing the subsequent set of data with the first pattern of data, to restore the initial set of data to provide a restored initial set of data.

23. The computer program product of claim 22 wherein the reading from the memory, the subsequent set of data of the sequence of linked-list entries further includes:
   reading location data stored in a pointer location field of the first linked-list entry to identify the location of the second, next-in-sequence linked-list entry of the sequence of linked-list entries within the memory;
   reading payload data stored in a payload field of an entry of the sequence of linked-list entries; and
   reading entry error correction code data stored in a header field in each of the first linked-list entry and the second, next-in-sequence entry.

24. The computer program product of claim 23 wherein detecting and correcting storage errors in the subsequent set of data further includes detecting and correcting data of the first linked-list entry and the second, next-in-sequence entry, as a function of the entry error correction code data stored in a header field in each of the first linked-list entry and the second, next-in-sequence entry, respectively.

25. The computer program product of claim 17 wherein the memory is a non-volatile flash memory having an erasable block of non-volatile memory, and wherein the processor operations further comprise changing all bits of an erasable block to a common bit state to erase an erasable block of the non-volatile flash memory wherein an erasable block is the smallest unit of the non-volatile memory capable of being erased at a time, wherein the first pattern is a string of bits which are exclusively of the common bit state, wherein the initial set of memory locations is a sector of the memory, and wherein the initial data structure fills the sector.

* * * * *